US011916667B1

(12) United States Patent
Hawkes

(10) Patent No.: US 11,916,667 B1
(45) Date of Patent: Feb. 27, 2024

(54) CUBIC LOW-DENSITY PARITY-CHECK CODE ENCODER

(71) Applicant: Tarana Wireless, Inc., Santa Clara, CA (US)

(72) Inventor: Kelly Davidson Hawkes, Santa Clara, CA (US)

(73) Assignee: Tarana Wireless, Inc., Milpitas, CA (US)

( * ) Notice: Subject to any disclaimer, the term of this patent is extended or adjusted under 35 U.S.C. 154(b) by 191 days.

(21) Appl. No.: 17/308,177

(22) Filed: May 5, 2021

Related U.S. Application Data

(62) Division of application No. 16/418,782, filed on May 21, 2019, now Pat. No. 11,032,023.

(51) Int. Cl.
*H03M 13/00* (2006.01)
*H04L 1/00* (2006.01)
*H04B 1/02* (2006.01)
*H03M 13/11* (2006.01)
*H04B 1/06* (2006.01)

(52) U.S. Cl.
CPC ....... *H04L 1/0045* (2013.01); *H03M 13/1105* (2013.01); *H03M 13/616* (2013.01); *H04B 1/02* (2013.01); *H04B 1/06* (2013.01)

(58) Field of Classification Search
CPC ............ H04L 1/0045; H03M 13/1105; H03M 13/616; H04B 1/02; H04B 1/06
USPC .......................................................... 714/776
See application file for complete search history.

(56) References Cited

U.S. PATENT DOCUMENTS

| 7,278,085 | B1 | 10/2007 | Weng et al. |
| 8,407,553 | B2 * | 3/2013 | Gunnam ........... H03M 13/3738 714/752 |
| 9,577,675 | B1 | 2/2017 | Varnica et al. |
| 10,425,112 | B2 | 9/2019 | Ikegaya et al. |
| 11,032,023 | B1 | 6/2021 | Hawkes |
| 2005/0149840 | A1 | 7/2005 | Lee et al. |
| 2007/0162814 | A1 * | 7/2007 | Shen .................. H03M 13/1185 714/752 |
| 2011/0029845 | A1 * | 2/2011 | Zhou ...................... H04L 1/005 714/776 |
| 2011/0307754 | A1 | 12/2011 | Sun et al. |
| 2012/0226956 | A1 | 9/2012 | Myung et al. |
| 2013/0013983 | A1 | 1/2013 | Livshitz et al. |
| 2013/0097475 | A1 | 4/2013 | Wang et al. |
| 2013/0216001 | A1 | 8/2013 | Petrov |

(Continued)

FOREIGN PATENT DOCUMENTS

WO   WO-2018103556 A1 *  6/2018  ............... H04L 1/00

OTHER PUBLICATIONS

U.S. Appl. No. 16/418,782 titled "Methods For Creating Check Codes, And Systems For Wireless Communication Using Check Codes" filed May 21, 2019.

(Continued)

*Primary Examiner* — Albert Decady
*Assistant Examiner* — Enam Ahmed
(74) *Attorney, Agent, or Firm* — Stoel Rives LLP

(57) ABSTRACT

Examples of check codes, methods of creating check codes, and communication systems utilizing check codes, such as low-density parity-check codes (LDPC codes) are described herein. In some examples, check codes described herein utilize a larger number of check operations than check bits.

23 Claims, 23 Drawing Sheets

(56) References Cited

U.S. PATENT DOCUMENTS

| | | | |
|---|---|---|---|
| 2014/0047304 A1* | 2/2014 | Murakami | H04L 1/0057 |
| | | | 714/776 |
| 2015/0227419 A1 | 8/2015 | Sakaue et al. | |
| 2016/0043740 A1* | 2/2016 | Ikegaya | H03M 13/1165 |
| | | | 714/776 |
| 2016/0049961 A1 | 2/2016 | Murakami | |
| 2016/0119001 A1 | 4/2016 | Fonseka et al. | |
| 2016/0149593 A1* | 5/2016 | Shin | A61M 25/0108 |
| | | | 714/776 |
| 2016/0191081 A1* | 6/2016 | Moon | H04L 1/0057 |
| | | | 714/776 |

OTHER PUBLICATIONS

Malema, Gabofetswe et al., Low Complexity Regular LDPC Codes for Magnetic Storage Devices, International Journal of Electrical and Computer Engineering, vol. 1, No. 7, 2007., pp. 1096-1098.

* cited by examiner

Code name 8-16c

200→

| Check Index | B | C | D | E | F | G | H | I | J | K | L | M | N | O | P | Q | Additional Check | Constant Row Wt |
|---|---|---|---|---|---|---|---|---|---|---|---|---|---|---|---|---|---|---|
| Type | I | I | C | C | I | I | I | C | I | I | I | C | C | C | C | C | | |
| x,y | 0,0 | 1,0 | 2,0 | 3,0 | 0,1 | 1,1 | 2,1 | 3,1 | 0,2 | 1,2 | 2,2 | 3,2 | 0,3 | 1,3 | 2,3 | 3,3 | | Row Wt |
| 0 | 1 | | | | 1 | | | | 1 | | | | 1 | | | | | 4 |
| 1 | | 1 | | | | 1 | | | | 1 | | | | 1 | | | | 4 |
| 2 | | | 1 | | | | 1 | | | | 1 | | | | 1 | | | 4 |
| 3 | | | 1 | 1 | | | | 1 | | | | | | 1 | | | | 4 |
| 4 | | | | 1 | | | | | 1 | 1 | | | | | | | A | 4 |
| 5 | | | | | | | | | 1 | 1 | 1 | 1 | | | | | | 4 |
| 6 | | | | | | | 1 | | | | 1 | | | | 1 | | | 4 |
| 7 | | | | | | | | | | | | 1 | 1 | 1 | 1 | | | 4 |
| 8 | | | | | | | | | | | | | | | 1 | 1 | E | 4 |
| Bits | | | | | | | | | | | | | | | | | | Variable Column Wt |
| Col Wt | 2 | 2 | 3 | 2 | 2 | 2 | 2 | 3 | 3 | 2 | 2 | 2 | 2 | 3 | 2 | 2 | | |

FIG. 2

Code name 8-16o

| | B | C | D | E | F | G | H | I | J | K | L | M | N | O | P | Q | | E | |
|---|---|---|---|---|---|---|---|---|---|---|---|---|---|---|---|---|---|---|---|
| | I | I | I | C | I | I | I | C | I | I | I | C | C | C | C | C | Type | | |
| x,y | 0,0 | 1,0 | 2,0 | 3,0 | 0,1 | 1,1 | 2,1 | 3,1 | 0,2 | 1,2 | 2,2 | 3,2 | 0,3 | 1,3 | 2,3 | 3,3 | | | Row Wt |
| Check Index | | | | | | | | | | | | | | | | | | | |
| 0 | 1 | | 1 | 1 | | | | | | | | | | | | | | | 4 |
| 1 | | 1 | | | | 1 | | | | | | | | | | | | | 4 |
| 2 | | | | | 1 | | 1 | | 1 | | | | | | | | | | 4 |
| 3 | 1 | | | | | 1 | | | 1 | 1 | | | | | | | | | 4 |
| 4 | | 1 | | | | | | | | | 1 | | | | | | | | 4 |
| 5 | | | 1 | | | | | 1 | | | | | | | | | | | 4 |
| 6 | | | | | | | 1 | | | | 1 | 1 | | | | | | | 4 |
| 7 | | | | 1 | | | | | | | | | | | | 1 | | 1 | 4 |
| Bits → | | | | | | | | | | | | | | | | | | | Constant Row Wt |
| Col Wt | 2 | 2 | 2 | 2 | 2 | 2 | 2 | 2 | 2 | 2 | 2 | 2 | 2 | 2 | 2 | 2 | | | Constant Column Wt |

*FIG. 4*

Code name 16-25

| Check Index | B | C | D | E | F | G | H | I | J | K | L | M | N | O | P | Q | R | S | T | U | V | W | X | Y | Z | Type | Row Wt |  |  |  |  |  |  |  |  | Constant Row Wt |
|---|---|---|---|---|---|---|---|---|---|---|---|---|---|---|---|---|---|---|---|---|---|---|---|---|---|---|---|---|---|---|---|---|---|---|---|---|
| | I | I | I | I | C | I | I | I | I | C | I | I | I | I | C | I | I | I | I | C | C | C | C | C | C | x,y | | | | | | | | | | |
| | 0,0 | 1,0 | 2,0 | 3,0 | 4,0 | 0,1 | 1,1 | 2,1 | 3,1 | 4,1 | 0,2 | 1,2 | 2,2 | 3,2 | 4,2 | 0,3 | 1,3 | 2,3 | 3,3 | 4,3 | 0,4 | 1,4 | 2,4 | 3,4 | 4,4 | | | | | | | | | | | |
| 0 | 1 | 1 | 1 | 1 | 1 |   |   |   |   |   |   |   |   |   |   |   |   |   |   |   |   |   |   |   |   | | 5 |   |   |   |   |   |   |   |   | |
| 1 |   |   |   |   |   | 1 | 1 | 1 | 1 | 1 |   |   |   |   |   |   |   |   |   |   |   |   |   |   |   | | 5 |   |   |   |   |   |   |   |   | |
| 2 |   |   |   |   |   |   |   |   |   |   | 1 | 1 | 1 | 1 | 1 |   |   |   |   |   |   |   |   |   |   | | 5 |   |   |   |   |   |   |   |   | |
| 3 |   |   |   |   |   |   |   |   |   |   |   |   |   |   |   | 1 | 1 | 1 | 1 | 1 |   |   |   |   |   | | 5 |   |   |   |   |   |   |   |   | |
| 4 | 1 |   |   |   |   | 1 |   |   |   |   | 1 |   |   |   |   | 1 |   |   |   |   | 1 |   |   |   |   | | 5 |   |   |   |   |   |   |   |   | |
| 5 |   | 1 |   |   |   |   | 1 |   |   |   |   | 1 |   |   |   |   | 1 |   |   |   |   | 1 |   |   |   | | 5 |   |   |   |   |   |   |   |   | |
| 6 |   |   | 1 |   |   |   |   | 1 |   |   |   |   | 1 |   |   |   |   | 1 |   |   |   |   | 1 |   |   | | 5 |   |   |   |   |   |   |   |   | |
| 7 |   |   |   | 1 |   |   |   |   | 1 |   |   |   |   | 1 |   |   |   |   | 1 |   |   |   |   | 1 |   | | 5 |   |   |   |   |   |   |   |   | |
| 8 |   |   |   |   | 1 |   |   |   |   | 1 |   |   |   |   | 1 |   |   |   |   | 1 |   |   |   |   | 1 | | 5 |   |   |   |   |   |   |   |   | |
| 9 |   |   |   |   |   |   |   |   |   | 1 |   |   |   |   | 1 |   |   |   |   | 1 | 1 | 1 | 1 | 1 | 1 | | 5 E |   |   |   |   |   |   |   |   | |
| Col Wt | 2 | 2 | 2 | 2 | 2 | 2 | 2 | 2 | 2 | 2 | 2 | 2 | 2 | 2 | 2 | 2 | 2 | 2 | 2 | 2 | 2 | 2 | 2 | 2 | 2 | 2 | | | | | | | | | | Constant Column Wt |

Code name 24-36c

800 ⟶

| Check Index | B | C | D | E | F | G | H | I | J | K | L | M | N | O | P | Q | R | S | T | U | V | W | X | Y | Z | AA | AB | AC | AD | AE | AF | AG | AH | AI | AJ | AK | Type | Row Wt | Additional Check |
|---|---|---|---|---|---|---|---|---|---|---|---|---|---|---|---|---|---|---|---|---|---|---|---|---|---|---|---|---|---|---|---|---|---|---|---|---|---|---|---|
|   | I | I | I | C | A | C | I | I | I | I | I | I | I | I | I | I | I | C | I | I | I | I | I | C | I | I | I | I | C | C | C | C | C | C | C | C | x,y | Row Wt | |
|   | 0,0 | 0,1 | 0,2 | 0,3 | 0,4 | 0,5 | 0,0 | 1,1 | 1,2 | 1,3 | 1,4 | 1,5 | 1,0 | 2,1 | 2,2 | 2,3 | 2,4 | 2,5 | 2,0 | 3,1 | 3,2 | 3,3 | 3,4 | 3,5 | 3,0 | 4,1 | 4,2 | 4,3 | 4,4 | 4,5 | 4,0 | 5,1 | 5,2 | 5,3 | 5,4 | 5,5 | | | |
| 0 | 1 | 1 | 1 |   |   |   | 1 | 1 | 1 |   |   |   | 1 | 1 | 1 |   |   |   | 1 | 1 | 1 |   |   |   |   |   |   |   |   |   |   |   |   |   |   |   | | 6 | |
| 1 |   | 1 | 1 | 1 |   |   |   | 1 | 1 | 1 |   |   |   | 1 | 1 | 1 |   |   |   | 1 | 1 | 1 |   |   |   |   |   |   |   |   |   |   |   |   |   |   | | 6 | |
| 2 |   |   | 1 | 1 | 1 |   |   |   | 1 | 1 | 1 |   |   |   | 1 | 1 | 1 |   |   |   | 1 | 1 | 1 |   |   |   |   |   |   |   |   |   |   |   |   |   | | 6 | |
| 3 |   |   |   | 1 | 1 | 1 |   |   |   | 1 | 1 | 1 |   |   |   | 1 | 1 | 1 |   |   |   | 1 | 1 | 1 |   | 1 |   |   |   |   |   |   |   |   |   |   | | 6 | |
| 4 | 1 |   |   |   | 1 | 1 |   |   |   |   | 1 | 1 |   |   |   |   | 1 | 1 |   |   |   |   | 1 | 1 |   |   | 1 |   |   |   |   |   |   |   |   |   | | 6 | A |
| 5 | 1 | 1 |   |   |   | 1 | 1 | 1 |   |   |   | 1 | 1 | 1 |   |   |   | 1 | 1 | 1 |   |   |   | 1 |   |   |   | 1 |   |   |   |   |   |   |   |   | | 6 | |
| 6 |   |   |   |   |   |   | 1 |   |   |   |   |   | 1 |   |   |   |   |   | 1 |   |   |   |   |   | 1 |   |   |   | 1 |   |   |   |   |   |   |   | | 6 | |
| 7 |   |   |   |   |   |   |   | 1 |   |   |   |   |   | 1 |   |   |   |   |   | 1 |   |   |   |   |   | 1 |   |   |   | 1 |   |   |   |   |   |   | | 6 | |
| 8 |   |   |   |   |   |   |   |   | 1 |   |   |   |   |   | 1 |   |   |   |   |   | 1 |   |   |   |   |   | 1 |   |   |   | 1 |   |   |   |   |   | | 6 | |
| 9 |   |   |   |   |   |   |   |   |   | 1 |   |   |   |   |   | 1 |   |   |   |   |   | 1 |   |   |   |   |   | 1 |   |   |   | 1 |   |   |   |   | | 6 | |
| 10 |   |   |   |   |   |   |   |   |   |   | 1 |   |   |   |   |   | 1 |   |   |   |   |   | 1 |   |   |   |   |   | 1 |   |   |   | 1 |   |   |   | | 6 | |
| 11 |   |   |   |   | 1 |   |   |   |   |   |   | 1 |   |   |   |   |   | 1 |   |   |   |   |   | 1 |   |   |   |   |   | 1 |   |   |   | 1 |   |   | | 6 | |
| 12 |   |   |   |   |   |   |   |   |   |   |   |   |   |   |   |   |   |   |   |   |   |   |   |   |   |   |   |   |   |   |   |   |   |   | 1 | 1 | | 6 | E |
| Col Wt | 2 | 2 | 2 | 2 | 3 | 2 | 2 | 2 | 2 | 3 | 2 | 2 | 3 | 2 | 2 | 2 | 2 | 2 | 3 | 2 | 2 | 2 | 2 | 2 | 2 | 2 | 2 | 2 | 3 | 2 | 2 | 2 | 3 | 2 | 2 | 2 | | Constant Row Wt | |
|        |   |   |   |   |   |   |   |   |   |   |   |   |   |   |   |   |   |   |   |   |   |   |   |   |   |   |   |   |   |   |   |   |   |   |   |   | | Variable Column Wt | |

Code name 32-48o

FIG. 14

Code name 12-20
1600

| | B | C | D | E | F | G | H | I | J | K | L | M | N | O | P | Q | R | S | T | U | |
|---|---|---|---|---|---|---|---|---|---|---|---|---|---|---|---|---|---|---|---|---|---|
| Type | I | I | I | C | I | I | I | C | I | I | I | C | I | I | I | C | C | C | C | C | Row Wt |
| x,y | 0,0 | 1,0 | 2,0 | 3,0 | 0,1 | 1,1 | 2,1 | 3,1 | 0,2 | 1,2 | 2,2 | 3,2 | 0,3 | 1,3 | 2,3 | 3,3 | 0,4 | 1,4 | 2,4 | 3,4 | |
| Check Index | | | | | | | | | | | | | | | | | | | | | |
| 0 | 1 | 1 | 1 | 1 | | | | | | | | | | | | | | | | | 4 |
| 1 | | | | | 1 | 1 | 1 | 1 | | | | | | | | | | | | | 4 |
| 2 | | | | | | | | | 1 | 1 | 1 | 1 | | | | | | | | | 4 |
| 3 | | | | | | | | | | | | | 1 | 1 | 1 | 1 | | | | | 4 |
| 4 | 1 | | | | 1 | | | | 1 | | | | 1 | | | | 1 | | | | 5 |
| 5 | | 1 | | | | 1 | | | | 1 | | | | 1 | | | | 1 | | | 5 |
| 6 | | | 1 | | | | 1 | | | | 1 | | | | 1 | | | | 1 | | 5 |
| 7 | | | | 1 | | | | 1 | | | | 1 | | | | 1 | | | | 1 | 5 |
| 8 | | | | | | | | | | | | | | | | | 1 | 1 | 1 | 1 | 4 |
| Col Wt | 2 | 2 | 2 | 2 | 2 | 2 | 2 | 2 | 2 | 2 | 2 | 2 | 2 | 2 | 2 | 2 | 2 | 2 | 2 | 2 | Variable Row Wt / Constant Column Wt |

FIG. 20

# CUBIC LOW-DENSITY PARITY-CHECK CODE ENCODER

CROSS-REFERENCE TO RELATED APPLICATION(S)

This application is a divisional of U.S. patent application Ser. No. 16/418,782, filed May 21, 2019, entitled "METHODS FOR CREATING CHECK CODES, AND SYSTEMS FOR WIRELESS COMMUNICATION USING CHECK CODES", issued as U.S. Pat. No. 11,032,023 on Jun. 8, 2021, which is incorporated by reference herein, in the entirety and for all purposes.

TECHNICAL FIELD

Examples of wireless communication systems are described herein, including methods for creating check codes, such as low-density parity-check codes (LDPC codes). Examples of check codes described herein may utilize a greater number of check operations than check bits.

BACKGROUND

Error correcting codes ("check codes") are often used to encode and/or decode data. The use of check codes typically involves inserting check bits into the data, where the value of the check bits is based on some or all of the data to be transmitted. The check bits are used on receipt to verify that the data has been accurately transmitted and/or to correct any erroneously transmitted data. Examples of check codes include low-density parity-check codes (LDPC codes). LDPC codes are linear codes which utilize a parity check matrix to formulate the code.

Existing LDPC code generators use a very large matrix—vector multiply to convert the information bits into check bits (which may also be referred to as code bits). For N code bits, K information bits, and M=N−K check bits, the generator matrix size is N×K, of which K×K is an identity matrix for the systematic bits and the remaining M×K are used to compute the check bits. For example, for a rate 3/4F code with M=768 and K=2304, the non-systematic portion of the generator matrix is 768×2304 (1,769,472 elements). Such large matrix multiply operations may be complex and intensive in the resources (e.g., time and hardware requirements) necessary to implement them.

BRIEF DESCRIPTION OF THE DRAWINGS

FIG. 2 is a parity check matrix representative of a check code named herein 8-16c and arranged in accordance with examples described herein.

FIG. 4 is a parity check matrix representative a check code named herein 8-16o and arranged in accordance with examples described herein.

FIG. 6 is a parity check matrix representative of a check code named herein 16-25 and arranged in accordance with examples described herein.

FIG. 8 is a parity check matrix representative of a check code named herein 24-36c and arranged in accordance with examples described herein.

FIG. 10 is a parity check matrix representative of a check code named herein 24-36o and arranged in accordance with examples described herein.

FIG. 12 is a parity check matrix representative of a check code named herein 32-48c and arranged in accordance with examples described herein.

FIG. 13 is a graphical representation of a check code named herein 32-48c and arranged in accordance with examples described herein.

FIG. 14 is a parity check matrix representative of a check code named herein 32-48o and arranged in accordance with examples described herein.

FIG. 16 is a parity check matrix representative of a check code named herein 12-20 and arranged in accordance with examples described herein.

FIG. 18 is a parity check matrix representative of a check code named herein 12-36 and arranged in accordance with examples described herein.

FIG. 20 is a parity check matrix representative of a check code named herein 8-27 and arranged in accordance with examples described herein.

DETAILED DESCRIPTION

Figure 1:
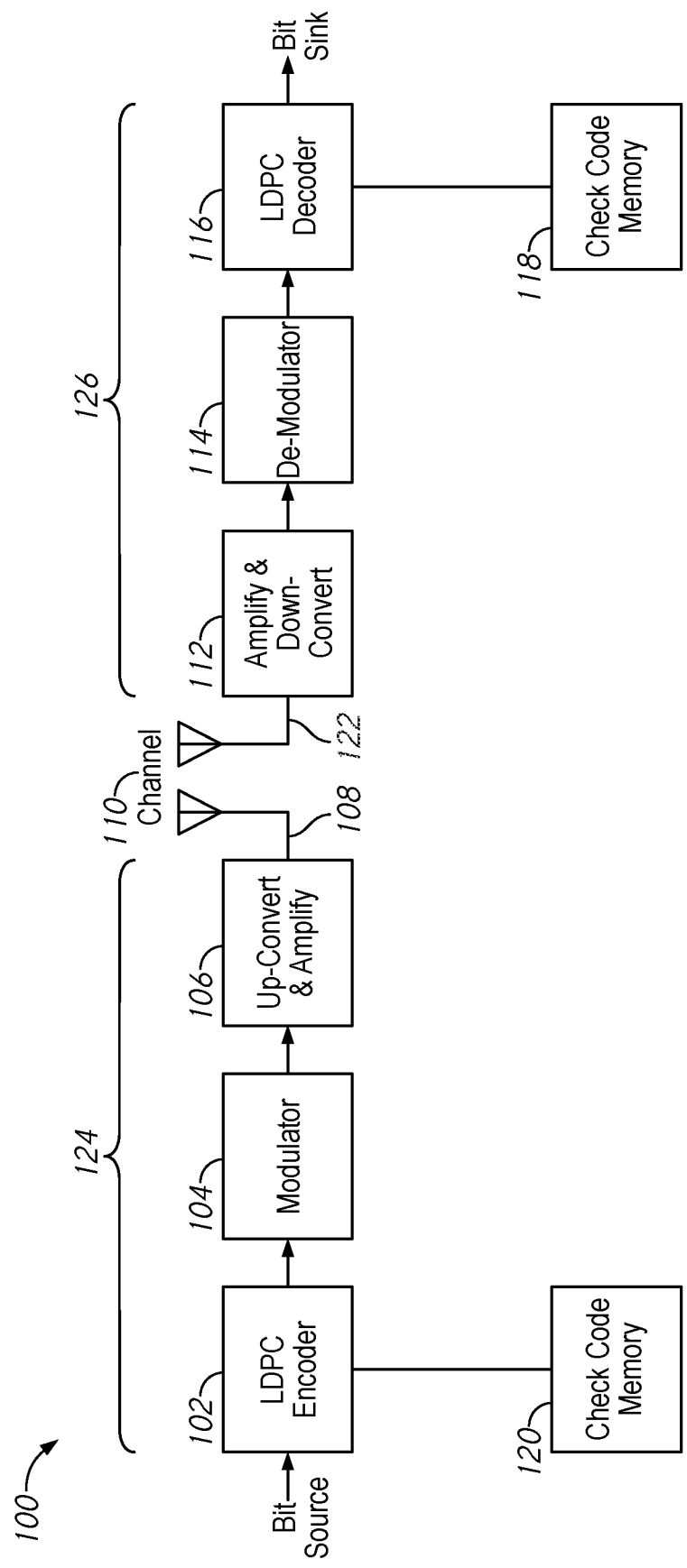
FIG. 1 is a schematic illustration of a system 100 in accordance with examples described herein.

Certain details are set forth herein to provide an understanding of described embodiments of technology. However, other examples may be practiced without various of these particular details. In some instances, well-known circuits, control signals, timing protocols, and/or software operations have not been shown in detail in order to avoid unnecessarily obscuring the described embodiments. Other embodiments may be utilized, and other changes may be made, without departing from the spirit or scope of the subject matter presented here.

Examples of systems and methods described herein include methods of generating check codes which may have reduced complexity and/or implementation cost than existing methodologies. For example, existing state-of-the art low-density parity-check codes typically have the same number of check rows in the parity matrix, A, as check bits. Examples described herein may include more check rows in the parity matrix (e.g. more check operations) than check bits. Utilizing a greater number of check operations (e.g., check rows in the parity matrix) may advantageously allow for a lower code word error rate as compared with a decoder utilizing a parity matrix for a check code that has an equal number of check rows and check bits.

Check codes, such as LDPC codes, are used to provide error checking capability in transmitted and received data streams. An example of generation of an LDPC code may consider a message vector m (e.g., information bits, such as data to be communicated) as a K×1 vector, and a code word (e.g., information bits plus check bits, such as data inserted into a data stream to be used in check operations to verify and/or correct the information bits) as an N×1 vector. The generator matrix G may therefore have a size N×K and the parity check matrix A is (N−K)×N, such that A G=0. M is the number of check bits, M=N−K, so that matrix A would be M×N.

Rows of a parity check matrix may be expressed as $$A = \begin{bmatrix} a_1^T \\ a_2^T \\ M \\ a_M^T \end{bmatrix}$$

where the equation $a_i^T c=0$ may be referred to as a linear parity-check constraint on the code word c, where the code word c is a vector of size N×1. The check operations, which may also be referred to as parity checks or checks may be expressed as $z_m$ where $$z_m = a_m^T c$$

For a code specified by a parity check matrix A, the corresponding generator matrix G may be used to encode data. A systematic generator matrix may be calculated using Gaussian elimination to find an M×M matrix $A_P^{-1}$ so that $$H = A_P^{-1} A = [I\ A_2].$$

If $A_P$ can't be found, then A may be said to be rank deficient, e.g. r=rank(A)<M In such a case, H may be found by truncating linearly dependent rows from $A_P^{-1} A$. The generator matrix G may then be given as $$G = \begin{bmatrix} A_2 \\ I \end{bmatrix}.$$

Note that $A_2$ is likely large in practice, and computing Atm may be resource-intensive. Moreover, removing linearly dependent rows from $A_P^{-1} A$ during calculation of the generator matrix G may not require or utilize removing rows from the parity check matrix A. Examples of code generation and code utilizing methods and systems described herein may provide for increased rows in the parity check matrix, which may provide a decoder (such as an LDPC decoder) additional constraints (e.g., check operations) for use in improved recovery of information bits.

FIG. 1 is a schematic illustration of a system 100 arranged in accordance with examples described herein. The system 100 includes a transmitter 124 and a receiver 126, with channel 110 between the transmitter 124 and receiver 126.

The transmitter 124 includes encoder 102, modulator 104, up-converter and amplifier 106, antenna 108, and check code memory 120. The receiver 126 includes antenna 122, amplifier and down-converter 112, demodulator 114, decoder 116, and check code memory 118. Additional, fewer and/or different components may be used in other examples, as well as different arrangements of components.

The transmitter 124 and receiver 126 of FIG. 1 may be implemented using wireless transmitters and/or receivers for wireless communication (e.g., Wi-Fi). The wireless communication may occur over channel 110 using any of a variety of wireless communication protocols. While a single antenna per receiver and transmitter are depicted in FIG. 1, any number may be used (e.g., multiple-input multiple-output (MIMO) systems may be used). While FIG. 1 is an example of a wireless communication system utilizing antennas (e.g., antenna 122 and antenna 108), other types of systems may also be used. For example, transmitters and/or receivers described herein may be implemented in one or more DSL modems using wired communication between the transmitter and the receiver. In other examples, transmitters and/or receivers may be implemented using modems (e.g., cable TV modems) which may communicate using wires such as coaxial cables and/or fiber optic cables. In this manner, a variety of transmitting and/or receiving systems may be implemented using coding techniques (e.g., LDPC codes) described herein.

Transmitters described herein may include an encoder, such as encoder 102 of FIG. 1. Encoders may receive information bits (e.g., data intended to be communicated to a receiver). In FIG. 1, the information bits are indicated as originating from a bit source. Any variety of bit sources may provide information bits for transmission to a receiver. For example, bit sources may include one or more data streams such as speech (e.g., telephone), files, video, image, text, sensor data, and/or other communications to be transmitted. The bit source may, for example, be implemented using a memory, communication medium, or other bit generating component found in one or more disk drives, computers, servers, tablets, sensors, wearable devices, appliances, automobiles, or other devices. Generally, a bit source may generate a message including information bits intended for transmission by systems described herein. Encoders may augment the information bits with check bits in accordance with one or more check codes described herein. For example, encoders may append check bits to the information bits provided (e.g., in a message) by the bit source, thus providing a total set of bits to be transmitted. In some examples, encoders may discard (e.g., puncture) some of the total set of bits, and the remaining bits may be transmitted (e.g., modulated, up-converted, amplified and transmitted across a channel).

Generally, check codes described herein may specify a number of check operations and the bits that are used in each check operation. Each check operation may utilize a subset of the information bits, certain of the check bits themselves, or combinations thereof. Generally, a check operation may refer to a combination of the bits used in that check operation. The check bit generated by a check operation may be, for example, a sum (using modulo-2 arithmetic) of the bits used in that check operation, although other types of combinations may be used. Check codes described herein may utilize a number of check operations that is greater than a number of check bits used to encode the data. In some examples, each of the check operations in a check code may utilize a same number of bits to generate a check bit (e.g., a row weight of each row of a check matrix may be equal).

In some examples, at least one of the check operations in a check code may utilize a different number of bits than another one of the check operations (e.g., a row weight of one of the rows of the check matrix may not be equal to the row weight of at least one other row). Check codes described herein may specify positions in a data stream at which to insert check bits.

In some examples, check codes described herein may be implemented using LDPC codes. In some examples, check codes described herein may be referred to as cubic low-density parity-check codes (cubic LDPC codes). Cubic LDPC codes generally are LDPC codes having a greater number of check operations than check bits. In some examples, such codes can be visualized in a geometric cube arrangement, giving rise to the term 'cubic.'

Check codes described herein may be stored in check code memory, such as check code memory 120 of FIG. 1. Generally any memory may be used including, but not limited to random access memory (RAM), read only memory (ROM), or other memory. The check code memory 120 may be accessible to encoder 102. The check code memory 120 may in some examples be integrated into the transmitter 124, and in other examples may be coupled to or otherwise in communication with the transmitter 124.

In this manner, encoders described herein, such as encoder 102, may encode information bits into an encoded data stream by augmenting the information bits with check bits calculated and positioned in accordance with one or more check codes described herein.

Examples of transmitters described herein may further include one or more modulators, such as modulator 104 of FIG. 1. Modulators may generally be used to generate signals representing the information bits and check bits provided by an encoder (e.g., by the encoder 102 of FIG. 1). Examples of modulators may divide encoded data (e.g., encoded bits) into subsets. Each subset may be converted by the modulator into various waveforms, each representing the corresponding subset. A modulator may, for example, combine the information bits and check bits with one or more carrier signals. A carrier source (e.g., a radio frequency source) may be provided to the modulator and the modulator may modulate that source in accordance with the information bits and check bits to provide signals indicative of the information bits and check bits. Modulators described herein may implement any of a variety of modulation techniques such as, but not limited to, PSK (phase shift keying), FSK (frequency-shift keying), ASK (amplitude-shift keying), and/or QAM (quadrature amplitude modulation).

Transmitters described herein may include a variety of additional components. For example, the transmitter 124 of FIG. 1 includes an up-converter and amplifier 106. The up-converter and amplifier 106 may alter (e.g., increase) a frequency of the signals generated by the modulator 104. Moreover, the amplifier 106 may amplify the signals generated by the modulator 104 and/or the up-converted signals generated by the modulator 104. The signals generated by the modulator 104 may be transmitted by the transmitter (e.g., using antenna 108 which may transmit the up-converted, amplified signals).

Receivers described herein, such as receiver 126 of FIG. 1, may include one or more demodulators, such as demodulator 114. Examples of demodulators described herein may demodulate input waveforms to provide demodulated encoded data. Demodulators may perform an opposite operation as described with respect to modulators described herein. For example, demodulators may remove a carrier signal (e.g., an RF carrier signal) portion of received signals.

In some examples, a demodulator may process each waveform corresponding to subsets of bits transmitted by a transmitter. The demodulator may compute a metric, such as a log-likelihood ratio (e.g., LLR) for each bit of the subset. The metric may have a particular value based on how likely the received bit is to be a particular state. For example, an LLR metric may have a positive value based on how likely the received bit is to be a 0 and a negative value based on how likely the received bit is to be a 1, or a 0 value if either state is equally likely. Other metrics and/or mappings may be used in other examples. The demodulated encoded data may include information bits and check bits, which may be been calculated and arranged in accordance with a particular check code.

Examples of receivers described herein, such as the receiver 126 of FIG. 1 may include one or more decoders, such as the decoder 116 of FIG. 1. The decoder may operate on received data (e.g., on demodulated encoded data provided by the demodulator 114). The decoder may decode the encoded data and/or may correct the encoded data utilizing the check bits. The decoder may perform a number of check operations on the encoded data in accordance with the particular check code used to encode the data. For example, the decoder may combine a number of bits used in a check operation and compare the result with the check bit included in the encoded data. If the result does not match, the decoder may change the value of one or more of the bits used in the check operation to agree with the check bit. Other operations may be performed in other examples. The decoder may remove the check bits from the encoded data and correct identified erroneous information bits. In some examples, the decoder may receive one or more metrics from the demodulator (e.g., LLR values) and may convert the metrics into information bits. Resulting information bits may be provided to another device (shown in FIG. 1 as a 'bit sink'). Any of a variety of devices may be used to implement the bit sink. For example, one or more computing devices (e.g., computers, servers, laptops, tablets, cell phones, routers, smartphones, smartwatches, appliances, automobiles, disk drives, switches, TVs, set-top boxes, etc.) may receive information bits received and decoded by receivers described herein.

Accordingly, decoders described herein may decode encoded data in accordance with one or more check codes. The check codes may be stored in a location accessible to the decoder, e.g., the check code memory 118 of FIG. 1. The check code memory 118 may be analogous to the check code memory 120 described with respect to the transmitter 124.

Generally, check codes may specify check operations and a subset of encoded data for use in each of the check operations. Any of a variety of check codes described herein may be used, and the number of check operations performed by a decoder may be greater than the number of check bits in the encoded data. In some examples, each of the check operations may utilize the same number of bits of the encoded data (e.g., the row weights of a parity matrix used may be the same). In some examples, one or more of the check operations may utilize a different number of bits of the encoded data than another of the check operations (e.g., the row weights of a parity matrix used may not all be the same). The check code may in some examples be an LDPC code. The check code may in some examples be a cubic low-density parity-check code.

Receivers described herein may include a variety of additional components. For example, the receiver 126 of FIG. 1 includes an antenna 122 and amplifier 112, and may further include a downconverter. The downconverter and amplifier 112 may alter (e.g., decrease) a frequency of the signals incident on the antenna 122. Moreover, the amplifier 112 may amplify the signals incident on the antenna 122 and/or the down-converted signals provided by the down-converter. In some examples, components of receivers, such as receiver 126 may add thermal or other noise to the received signals. The signals incident on the antenna 122 may be transmitted by transmitters described herein, such as by the transmitter 124 over the channel 110.

FIG. 2 is a parity check matrix 200 which may represent a check code arranged in accordance with examples described herein. The parity check matrix 200 is associated with a code having K=8 information bits and N=16 coded bits (e.g., 8 check bits are included in the encoded data for each 8 information bits). The type of bits in an encoded bit stream are shown at the top of the matrix in a row labeled "Type". An "I" indicates information bit and a "C" indicates check bit. This notation will be reused for other parity check matrices disclosed and described herein. In the example of parity check matrix 200 of FIG. 2, the encoded bit stream types are IICCIIICIIICCCCC—which represents two information bits, followed by two check bits, followed by three information bits, followed by a check bit, followed by three information bits, followed by five check bits. In this example, accordingly, 8 information bits may be encoded into a 16 bit string.

For ease of reference, the columns of the parity check matrix 200 are labeled B through Q in FIG. 2 and a "check index" is provided labeling each row as between 0 and 8. A similar notation is used for other parity check matrices described and depicted herein. An x,y position indicator is also provided for each bit, and refers to a location of the bit in a two-dimensional grid arrangement described herein. In the example of FIG. 2, the bit represented by column B is at the x,y position 0,0. The bit represented by column C is at the x,y position 1,0. The bit represented by column D is at the x,y position 2,0. The bit represented by column E is at the x,y position 3,0. The bit represented by column F is at the x,y position 0,1. The bit represented by column G is at the x,y position 1,1. The bit represented by column H is at the x,y position 2,1. The bit represented by column I is at the x,y position 3,1. The bit represented by column J is at the x,y position 0,2. The bit represented by column K is at the x,y position 1,2. The bit represented by column L is at the x,y position 2,2. The bit represented by column M is at the x,y position 3,2. The bit represented by column N is at the x,y position 0,3. The bit represented by column O is at the x,y position 1,3. The bit represented by column P is at the x,y position 2,3. The bit represented by column Q is at the x,y position 3,3. The column D in the parity check matrix 200 is an additional check bit denoted by an 'A' at the top of the column. The additional check bit is calculated in the check operation associated with row 3, and that row is also denoted with an 'A' in FIG. 2.

Generally, each row of the parity check matrix 200 represents a check operation, and each column of the parity check matrix 200 represents a bit in an encoded bit stream. The presence of a '1' in a cell of the parity check matrix 200 indicates that the bit of that column is used by the check operation of that row. Accordingly, the placement of the 1's in the row indicates the subset of bits used in a check operation. A similar notation is used in other example parity check matrices disclosed and described herein. Other graphical or other representations of check matrices may also be used.

Row weights for each row of the parity check matrix 200 are shown in FIG. 2. The row weights refer to the number of bits used in the check operation associated with that row. In the example of parity check matrix 200, the row weights are all equal (e.g., the same number of bits are used in each check operation). The row weight for each row of parity check matrix 200 is $w_r=4$, indicating that each check operation utilizes four bits. Column weights for each column of the parity check matrix 200 are shown in FIG. 2. The column weights refer to the number of check operations that utilize a particular bit. In the example of FIG. 2, the column weights vary (e.g., certain bits in the encoded bit stream are utilized in different numbers of check operations than other bits). Column weights for the columns of parity check matrix 200 are either $w_c=2$ or $w_c=3$, indicating that each bit is used in either 2 check operations or in 3 check operations. Cells which are shaded in the parity check matrix 200 indicate that the value of the check bit associated with that cell is a combination of the other bits in that row (e.g., the other bits used in the check operation). Accordingly, the check operation of each row utilizes the bits in cells containing '1' of that row to combine to provide a value of the shaded cell in the row. For example, in row 0, the information bits at columns F, G, and H are combined to calculate the value of the check bit at column I. For example, the check operation of row 0 may specify that the combination (e.g., a binary sum using modulo-2 arithmetic or a cumulative exclusive-or) of the bits at row F, G, H, and I must be a predetermined value (such as 0), which may be expressed as:

$$z_0 = c_F + c_G + c_H + c_I$$

where $z_0$ is the predetermined value and $c_F$, $c_G$, $c_H$, $c_I$ refer to the bits in columns F, G, H, and I, respectively.

Accordingly, if $z_0=0$, the exclusive-or of the bits in columns F, G, H, and I must be 0. The check bit at column I may be calculated accordingly. Blanks in the parity check matrix 200 may in some examples be depicted as 0s, but are omitted for ease of illustration herein (as they are omitted from other illustrations of parity check matrices herein). The parity check matrix 200 may be used in an LDPC code, and the low density of 1's further reinforces the low density of 1s used. The check bit at column I may accordingly be computed (e.g., by encoders described herein) using the bits at columns F, G, and H, as follows:

$$c_I = C_F + C_G + C_H$$

This ensures that the exclusive-or of columns F, G, H, and I is 0, which can be seen as follows:

$$z_0 = C_F + C_G + C_H + (C_F + C_G + C_H) = 0$$

Similar notation is used on other check matrices described or depicted herein. In row 1, the information bits at column B, F, and J are combined to provide the check bit at column N. In row 2, the information bits at column C, G, and K are combined to provide the check bit at column O. In row 3, the previously-calculated check bit at column I, the information bit at column J, and the previously-calculated check bit at column O are combined to provide the check bit at column D. In row 4, the information bit at column B, the information bit at column C, and the previously-calculated check bit at column D are combined to provide the check bit at column E. In row 5, the information bits at columns J, K, and L are combined to provide the check bit at column M. In row 6, the previously-calculated check bit at column D is combined with the information bits at columns H and L to provide the check bit at column P. In row 7, the previously-calculated check bits at columns N, O, and P are combined to provide the check bit at column Q. In row 8, the previously-calculated check bits at columns E, I, M, and Q are used in an extra check operation. The extra check operation is denoted by an "E" at the end of that row. A similar notation is used for other matrices depicted or described herein. Generally, to generate a value of a check bit, certain information bits may be combined and/or certain information bits may be combined with previously-calculated check bits and/or previously-calculated check bits may be combined to generate values of other check bits.

The check code memory 120 of FIG. 1 contains information describing how to compute the check bit shown with a shaded cell for each check row of FIG. 2. For example, for check row 0, it would contain the information that columns F, G, and H are used to generate the check bit for column I. For check row 7, it would contain the information that columns N, O, and P are used to generate the check bit for column Q. Furthermore, the check code memory 120 of FIG. 1 would contain information describing the sequence of placing information bits from the bit source into which columns of FIG. 2. Likewise, the check code memory 120 of FIG. 1 would contain information describing the mapping of columns of FIG. 2 into the coded bit stream send to the modulator.

While examples of how to calculate check bits based on the bits used in a particular check operation have been described, it is to be understood that a reverse operation may be used by decoders to decode encoded data in accordance with check codes described herein. For example, the check operations may be used to verify accuracy of received data and/or to correct received data on failure of one or more check operation. For example, decoders may evaluate the check operations using the received bits. If one or more check operation fails (e.g., the combination of bits in the check operation does not yield the value of the check bit), then the decoder may flag the bits as suspect, in error, and/or may correct the bits using information from other check operations.

Generally, columns of parity check matrices, such as parity check matrix 200 may be arranged in any permutation, and an identical performing code may result. The sequence of columns in parity check matrix 200 was selected to have the x dimension vary faster than they dimension, but other column arrangements may be used.

Note that the parity check matrix 200, and other parity check matrices described herein, may correspond to the matrix A in the mathematical explanation of parity check code usage and methodology described herein. The construction (e.g., arrangement) of parity check matrices described herein may facilitate the generation of $A_2$ in a manner which may reduce the resources used in computing $A_2m$. For example, without use of the code generation techniques described herein, the $A_2m$ operation may include millions of multiply operations. The arrangement of codes described herein, however, may allow for the numbers of multiply operations to be reduced by order(s) of magnitude in some examples (e.g., to 1000 or 1000s of multiplies).

Encoders described herein (such as encoder 102 of FIG. 1) may compute check bits one at a time and in a recursive manner (e.g., proceeding from row 0 to row 7 of parity check matrix 200 of FIG. 2). Rows may be provided in a sequence such that any new check bit for a particular check row may be recursively computed from information bits and previously-computed check bits. The extra check (e.g., row 8 of parity check matrix 200) may not be used by an encoder to generate a check bit, but may be used by decoders described herein to decode encoded data and/or provide error correction. Note that check codes described herein, such as the check code represented by parity check matrix 200 of FIG. 2 have more check operations than check bits. The parity check matrix 200, for example, has 9 check operations and 8 check bits.

Parity check matrices described herein, such as parity check matrix 200, are representations of check codes. Other representations of check codes may also be used (e.g., arrangements of displaying and/or storing an indication of check operations and bits used in the check operations). Check codes described herein, such as parity check matrix 200, may be stored in check code memories, such as check code memory 118 and/or check code memory 120 of FIG. 1 and may be used to encode information bits and/or decode information bits from encoded data.

Figure 3:
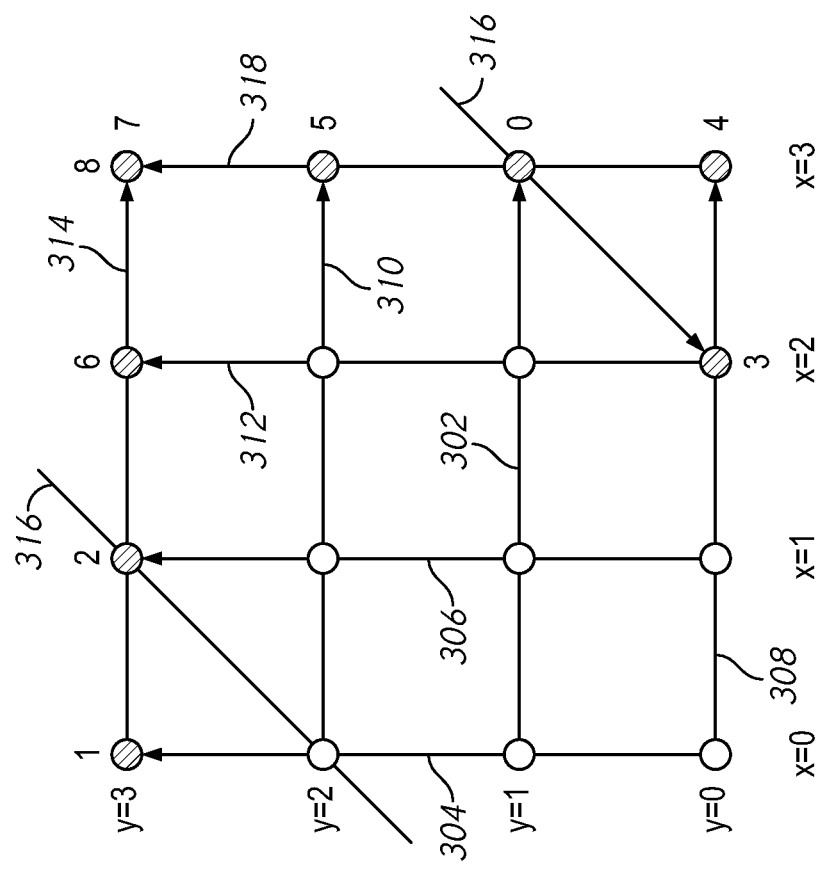
FIG. 3 is a graphical representation of a check code named herein 8-16c and arranged in accordance with examples described herein.

FIG. 3 is a geometrical representation of a check code arranged in accordance with examples described herein. The graphical representation 300 may be a graphical representation of the check code also represented by parity check matrix 200 of FIG. 2. The graphical representation 300 is provided to aid in understanding of how check codes described herein may be generated (e.g., using an encoder, such as encoder 102 of FIG. 1). The check code represented in FIG. 3 is an LDPC code and may be referred to as a cubic LDPC code.

In the graphical representation 300, circles representative of bits are shown arranged in rows and columns. One bit is provided at each intersection of a row and a column (e.g., each position defined by a respective row and column). information bits are shown as open circles, while check bits are shown as shaded circles. The columns are each identified in FIG. 3 by a respective x coordinate ranging from 0 to 3. The rows are each identified in FIG. 3 by any coordinate ranging from 0 to 3. Similar notation is used in other graphical representations of check codes described or depicted herein. Since there are a total of 4 rows and an equal number of columns, the depicted two-dimensional code is symmetric and has a total number of bits T=4×4=16. The number of basic bits is B=(4−1)×(4−1)=3×3=9. The basic bits are shown in FIG. 3 in the lower left hand corner with x≤2 and y≤2. One of these basic bits is not an information bit but instead will be an additional check bit (x,y)=(2,0). The use of an additional check bit changes the code from a 9-16 code into a rate 1/2 code which may be referred to as an 8-16c code, where 8 refers to 8 information bits, 16 refers to 16 coded bits, and c refers to the presence of an additional check bit. The check bits are represented in graphical representation 300 along the right hand side at x=3, and along the top at y=3. Note that the check bit (x,y)=(3,3) may only need to be computed once by a code generator (e.g., an encoder) as the sum across the top row, but may be used herein (e.g., by a decoder) as the sum across the top row and the sum across the right most column. Accordingly, this check may be referred to as an extra parity check as shown in the parity check matrix 200 of FIG. 2.

The indices at (2,0), on the right-hand side, and at the top of FIG. 3 refer to the check indices of FIG. 2 (e.g., the row number or check operation number). The arrow heads in FIG. 3 point to the check bits computed by the code generator (e.g., encoder). The bits are positioned in FIG. 3 according to their x,y coordinates given in FIG. 2.

Accordingly, arrow 302 of FIG. 3 is corresponds with check operation 0 (e.g., check index 0) of FIG. 2. The arrow 302 is a horizontal arrow that points to a check bit at (x,y) position (3,1) of FIG. 3. The arrow 302 touches all of the bits in the second horizontal row. The parity constraint associated with arrow 302 (e.g., check operation 0) may be expressed in bit positions as (3,1)=(0,1)+(1,1)+(2,1). The arrow 304 of FIG. 3 corresponds with the check operation 1 of FIG. 2. The arrow 304 is a vertical arrow that points to a check bit at position (0,3) of FIG. 3. The arrow 304 touches all the bits in the first vertical column. The parity constraint associated with arrow 304 (e.g., check operation 1) may be expressed in bit positions as (0,3)=(0,0)+(0,1)+(0,2). The arrow 306 of FIG. 3 corresponds with the check operation 2 of FIG. 2. The arrow 306 is a vertical arrow that points to a check bit at position (1,3) of FIG. 3. The arrow 306 touches all the bits in the second vertical column. The parity constraint associated with arrow 306 (e.g., check operation 2) may be expressed in bit positions as (1,3)=(1,0)+(1,1)+(1,2). The arrow 308 of FIG. 3 corresponds with the check operation 4 of FIG. 2. The arrow 308 is a horizontal arrow that points to a check bit at position (3,0) of FIG. 3. The arrow 308 touches all the bits in the first horizontal row. The parity constraint associated with arrow 308 (e.g., check operation 4) may be expressed in bit positions as (3,0)=(0,0)+(1,0)+(2,0). The arrow 310 of FIG. 3 corresponds with the check operation 5 of FIG. 2. The arrow 310 is a horizontal arrow that points to a check bit at position (3,2) of FIG. 3. The arrow 310 touches all the bits in the third horizontal row. The parity constraint associated with arrow 310 (e.g., check operation 5) may be expressed in bit positions as (3,2)=(0,2)+(1,2)+(2,2). The arrow 312 of FIG. 3 corresponds with the check operation 6 of FIG. 2. The arrow 312 is a vertical arrow that points to a check bit at position (2,3) of FIG. 3. The arrow 312 touches all the bits in the third vertical column. The parity constraint associated with arrow 312 (e.g., check operation 6) may be expressed in bit positions as (2,3)=(2,0)+(2,1)+(2,2). The arrow 314 of FIG. 3 corresponds with the check operation 7 of FIG. 2. The arrow 314 is a horizontal arrow that points to a check bit at position (3,3) of FIG. 3. The arrow 314 touches all the bits in the third horizontal row. The parity constraint associated with arrow 314 (e.g., check operation 7) may be expressed in bit positions as (3,3)=(0,3)+(1,3)+(2,3). The arrow 318 of FIG. 3 corresponds with the check operation 8 of FIG. 2. The arrow 318 is a vertical arrow that points to a check bit at position (3,3) of FIG. 3. The arrow 318 touches all the bits in the third vertical column. The parity constraint associated with arrow 318 (e.g., check operation 8) may be expressed in bit positions as (3,3)=(3,0)+(3,1)+(3,2). Note that the check bits are located at bit positions (0,3), (1,3), (2,3), (3,3), (2,0), (3,0), (3,1), and (3,2) while information bits are located at bit positions (0,0), (0,1), (0,2), (1,0), (1,1), (1,2), (2,1), and (2,2). Other arrangements may be used in other examples.

The check operation 3 of FIG. 2 is represented in FIG. 3 using a diagonal arrow 316, which is shown in two parts. The arrow 316 points to check bit at position (2,0) and represents the additional check bit of FIG. 2. The diagonal arrow 316 touches bits at various column and row positions and the parity constraint may be written as (2,0)=(3,1)+(0,2)+(1,3). Accordingly, the diagonal arrow 316 touches a bit in each column and in each row of FIG. 3 graphical representation 300. In this manner the diagonal arrow 316 has no more than one bit in common with any other check operation. Note that modulo arithmetic may be used to relate the columns of the graphical representation 300, which may be written as:

$$x_i = \mathrm{mod}(b_x i, N_x)$$

where $x_i$ is the column index for the $i^{th}$ participant in the check operation, $b_x$ is the stride (e.g., a positive non-zero integer, that is not a divisor of $N_x$, other than 1), and $N_x$ is the width (e.g., 4 columns for FIG. 3). Similar formulas may be used for they dimension of two-dimensional codes, and for the z dimension of three-dimensional codes. Other paths through the two-dimensional figure are possible for the additional check (e.g., corresponding to check operation 3 of FIG. 2). For example, a check operation may be devised and represented by a diagonal arrow sloping from lower right to upper left, $b_x=3$, $b_y=1$. Other relationships to calculate the additional check bit are possible. Generally, the additional check bit may be calculated using bits at column and row positions such that no more than one bit from each row and no more than one bit from each column are used in the check.

The Hamming distance for two-dimensional cubic LDPC codes is 4 because there are 4 vertices of any rectangle within FIG. 3. Suppose that the information bit at (0,0) changes value, then check index 4 causes (3,0) to toggle, check index 1 causes (0,3) to toggle, and check index 8 causes (3,3) to toggle, a total of 4 bits that change value when going from one code word to another.

The graphical representation 300 in FIG. 3 is a graphical representation of a check code arranged in accordance with examples described herein to facilitate explanation of how the check code may be generated and what information the check code may contain. Check codes may be generated by encoders described herein, such as encoder 102 of FIG. 1, and/or may be generated by one or more code generators. A code generator may be implemented, for example using circuitry (e.g., one or more processors, controllers, and/or circuitry such as but not limited to one or more application specific integrated circuits (ASICs) or field programmable gate arrays (FPGAs)). In some examples, a code generator may be wholly and/or partially implemented in software and/or firmware (e.g., utilizing executable instructions encoded on a computer readable media and executable by one or more processors or other circuitry). The code generator may generate check codes which may be stored (e.g., in check code memory 118 and/or check code memory 120 of FIG. 1).

Methods of generating check codes, such as low-density parity-check codes may include arranging information bits in rows and columns of a two-dimensional matrix, as shown for example with graphical representation 300 of FIG. 3 where the information bits are arranged at bit positions (0,0), (0,1), (0,2), (1,0), (1,1), (1,2), (2,1), and (2,2), each location corresponding with an intersection of a row and a column. It is to be understood that in some examples, the arranging may not include physically representing the bits in rows and columns, but the arranging may include the process of designating, identifying, and/or enumerating the information bits using identifiers which may correspond with the described rows and column, and/or accessing or manipulating the bits in a manner corresponding with how they would be arranged in such a two-dimensional matrix. While a two-dimensional matrix is shown in the example graphical representation 300 of FIG. 3, in other examples, a three-dimensional matrix may be used.

Once arranged in rows and columns, note that the information bits may not completely fill all positions associated with row and column intersections. For example, in the graphical representation 300, bit position (2,0) is not associated with an information bit. Accordingly, at least one position defined by a row and column may not be associated with an information bit. The location of that position may vary, and may generally be selected to be anywhere within the 3×3 grid containing information bits shown in FIG. 3. In some examples, multiple positions defined by certain row and column pairs are not associated with any information bit. Check bits may be calculated and associated with those multiple positions in some examples.

Having arranged the information bits in rows and columns, methods of generating check codes, such as low-density parity-check codes may include calculating an extra row of check bits, each of the check bits in the extra row calculated using the information bits or previously calculated check bits in a respective column of the columns. For example, the row of check bits at the row y=3 in FIG. 3 may be calculated based on information bits and/or previously calculated check bits in the respective columns. For example, the check bit at position (0,3) may be calculated based on a combination (e.g., an exclusive or) of the information bits in the column x=0. The check bit at position (2,3) in the row y=3 may be calculated based on a combination (e.g., an exclusive or) of the information bits and the previously-calculated check bit in the column x=2.

Having arranged the information bits in rows and columns, methods of generating check codes, such as low-density parity-check codes, may additionally or instead of calculating an extra row of check bits include calculating an extra column of check bits. Each of the check bits in the extra column may be calculated using the information bits or previously calculated check bits in a respective row of the rows. For example, the column of check bits at x=3 in FIG. 3 may be calculated based on information bits and/or previously calculated check bits in the respective rows. For example, the check bit at bit position (3,2) may be calculated based on a combination (e.g., an exclusive or) of the information bits in the row y=2. The check bit at bit position (3,0) may be calculated based on the information bits in the row y=0 and the previously-calculated check bit in the row y=0.

Having arranged the information bits in rows and columns, methods of generating check codes, such as low-density parity-check codes, may calculate a check bit for any row and column intersection positions not associated with information bits (e.g., the bit position (2,0) in FIG. 3). A check operation may be used to generate the check bit at that position using bits located at a diagonal pattern of columns and rows (e.g., as shown by arrow 316 in FIG. 3). In some examples, multiple bit positions may be present that are not associated with information bits, and multiple diagonal patterns may be used to calculate check bits for those locations.

Note that the numbered check operations in FIG. 3 may occur sequentially, such that any previously-calculated check bits used to generate another check bit may be calculated before they are needed for use in a subsequent check bit calculation. For example, the check bit at bit position (2,0) may be calculated by check operation 3, which may occur before check operation 4. Check operation 4 may then utilize the check bit at bit position (2,0) to calculate the check bit at bit position (3,0). Accordingly, the calculation of an extra row of check bits, an extra column of check bits, and check bits for row/column intersections not associated with information bits, may not occur strictly sequentially. Rather, individual check bits forming that extra row, column, and/or filling in those unassociated locations may be calculated in an order such that later dependent check operations may utilize predecessor check bits.

Accordingly, methods for creating check codes (e.g., low-density parity-check codes) described herein may include placing coded bits including information bits, 0 or more constant bits, and check bits in a three-dimensional matrix having ranks, columns, and rows. The values of the check bits are calculated such that the modulo-2 sum across the ranks of all combinations of columns and rows and across the columns of all combinations of ranks and rows, and across the rows of all combinations of ranks and columns is 0.

The check bits may be further calculated such that the modulo-2 sum across one or more paths through the matrix are 0, the length of each such path being equal to the minimum of the number of ranks, columns, and rows, and each bit of such path not having the same rank as any other bit of such path, each bit of such path not having the same column as any other bit of such path, and each bit of such path not having the same row as any other bit of such path.

In examples where a two-dimensional matrix is used, methods for generating coded bits of a low-density parity-check code may include arranging basic bits (e.g., information bits and 0 or more constant bits and/or additional check bits) in $N_x-1$ columns and $N_y-1$ rows of a two-dimensional matrix. The methods may include calculating the $N_x$ column as check bits, each of the check bits in the $N_x$ column being the sum modulo 2 across columns 1 to $N_x-1$ for each row y, $1 \leq y \leq N_y-1$, and calculating the $N_y$ row as check bits, each of the check bits in the $N_y$ row being the sum modulo 2 across rows 1 to Ny−1 for each combination of columns x, $1 \leq x \leq N_x$. Other examples include different sequences of computing the check bits across the various dimensions.

Examples of methods for creating check codes (e.g., low-density parity-check codes), may include placing coded bits including information bits, 0 or more constant bits, and check bits in a two-dimensional matrix having columns and rows. The values of such check bits may be selected such that the modulo-2 sum across the columns of each row, and across the rows of each column is 0. The values of the check bits may be further selected such that the modulo-2 sum across one or more paths through the matrix is 0, the length of each such path being equal to the minimum of the number of columns and rows, each bit of such path not having the same column as any other bit of such path, and each bit of such path not having the same row as any other bit of such path.

FIG. 4 is a parity check matrix representative a check code arranged in accordance with examples described herein. The notation of the parity check matrix 400 of FIG. 4 is analogous to that of the parity check matrix 200 of FIG. 2. The parity check matrix 400 is representative of a check code which may be generated by code generators described herein and may be stored and utilized by encoders and/or decoders described herein (e.g., encoder 102 and/or decoder 116 of FIG. 1). The parity check matrix 400 depicts an example where a constant bit has been used in the bit stream. A constant bit refers to a bit which has a predetermined, known state (e.g., 0 or 1). The constant bit may not vary based on either the information bits and/or the check bits, for example. Rather, the constant bit may have a known value in the code.

Referring to the parity check matrix 400 of FIG. 4, the code is described as containing 16 bits for every 8 information bits. Accordingly, 16 bits are shown in FIG. 4, corresponding to columns labeled B through Q. The bit stream for the encoded data is IIOCIIICIIICCCCC, which refers to two information bits, followed by a constant bit (denoted '0' in the bit stream), followed by a check bit, followed by three information bits, followed by a check bit, followed by three information bits, and followed by five check bits. The parity check matrix 400 may be referred to as depicting a code named 8-16o, where the 8 refers to the number of information bits, 16 refers to the number of coded bits used to encode the 8 bits, and o refers to the use of a constant bit in the bit stream. Accordingly, the bit stream may be said to have 9 basic bits—e.g., eight information bits and one constant bit.

The constant bit may generally be placed in any basic bit position. In FIG. 4, the constant bit is at the bit position of column D. Decoders described herein, such as decoder 116 of FIG. 1 may, on receipt of the constant bit, replace the metric calculated for that bit (such as the log-likelihood ratio) with a representation of the most confident metric (e.g., certainty that the bit is of the known state). Examples of encoders and decoders described herein may utilize synchronization to identify the predetermined position and value of the constant bit.

The parity check matrix 400 of FIG. 4 includes 8 check operations and 7 check bits. In check operation 0, the information bits at columns B and C and the constant bit at column D are used to calculate the check bit at column E. In check operation 1, the information bits at columns F, G, and H are used to calculate the check bit at column I. In check operation 2, the information bits at columns J, K, and L are used to calculate the check bit at column M. In check operation 3, the information bits at columns B, F, and J are used to calculate the check bit at column N. In check operation 4, the information bits at columns C, G, and K are used to calculate the check bit at column O. In check operation 5, the constant bit at column D and the information bits at columns H and L are used to calculate the check bit at column P. In check operation 6, the previously-calculated check bits at columns E, I, and M are used to calculate the check bit at column Q. In check operation 7, the previously-calculated check bits N, O, P, and Q are used.

Accordingly, the parity check matrix 400 of FIG. 4 has one less check bit and one less check operation than the parity check matrix 200 of FIG. 2. However, the column weight of the parity check matrix 400 is constant for all columns, which may reduce implementation complexity at the decoder in some examples. The row weights for each row and column weights for each column are shown in FIG. 4. The row weights are equal for all rows. The column weights are equal for all columns. Other row and column weights are possible in other examples. The x,y position of the bits in a two-dimensional matrix are also shown in FIG. 4, below the bit stream.

Figure 5:
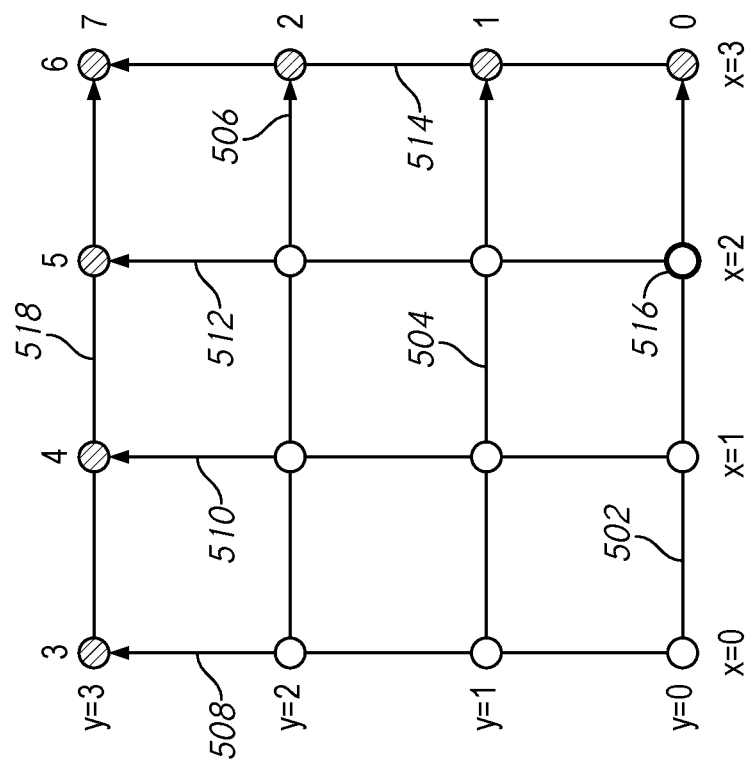
FIG. 5 is a graphical representation of a check code named herein 8-16o and arranged in accordance with examples described herein.

FIG. 5 is a graphical representation of a check code arranged in accordance with examples described herein. The graphical representation 500 may be a graphical representation of the check code also represented by parity check matrix 400 of FIG. 4. The notation used in FIG. 5 is analogous to that used and described with reference to the graphical representation 300 of FIG. 3. The graphical representation 500 is provided to aid in understanding how the check code may be generated (e.g., using an encoder, such as encoder 102 of FIG. 1). The check code represented in FIG. 5 is an LDPC code and may be referred to as a cubic LDPC code.

In the graphical representation 500, circles representative of bits are shown arranged in rows and columns. One bit is provided at each intersection of a row and a column (e.g., each position defined by a respective row and column). Information bits are shown as not bold open circles, while check bits are shown as shaded circles. The constant bit is shown as a bold open circle. The columns are each identified in FIG. 5 by a respective x coordinate ranging from 0 to 3. The rows are each identified in FIG. 3 by an y coordinate ranging from 0 to 3. The number of basic bits is B=(4−1)× (4−1)=3×3=9 (e.g., eight information bits and one constant bit). The total number of bits T=4×4=16.

In graphical representation 500, the information bits are illustrated at bit positions (0,0), (1,0), (0,1), (1,1), (2,1), (0,2), (1,2), and (2,2). The check bits are illustrated at bit positions (0,3), (1,3), (2,3), (3,3), (3,0), (3,1), and (3,2). The constant bit is shown at bit position (2,0). Other bit positions may be used for the information bits, check bits, and/or constant bit in other examples.

The indices on the right-hand side and at the top of FIG. 5 refer to the check indices of FIG. 4 (e.g., the row number or check operation number). The arrow heads in FIG. 5 point to the check bits computed by the code generator (e.g., encoder). The bits are positioned in FIG. 5 according to their x,y coordinates given in FIG. 4.

Accordingly, arrow 502 of FIG. 5 corresponds with check operation 0 of FIG. 4. The arrow 502 is a horizontal arrow that points to a check bit at position (3,0) of FIG. 5. The arrow 502 touches all of the bits in the first horizontal row. The parity constraint associated with arrow 502 may be expressed in bit positions as (3,0)=(0,0)+(1,0)+(2,0). Note that two information bits and the constant bit are used. The arrow 504 corresponds with check operation 1 of FIG. 4. The arrow 504 is a horizontal arrow that points to a check bit at position (3,1) of FIG. 5. The arrow 504 touches all bits in the second horizontal row. The parity constraint associated with arrow 504 may be expressed in bit positions as (3,1)=(0,1)+(1,1)+(2,1). The arrow 508 is associated with the check operation 3 of FIG. 4. The arrow 508 is a vertical arrow that touches all bits in the first vertical column. The parity constraint associated with arrow 508 may be expressed as (0,3)=(0,0)+(0,1)+(0,2). The arrow 510 is associated with the check operation 4 of FIG. 4. The arrow 510 is a vertical arrow that touches all bits in the second vertical column. The parity constraint associated with arrow 510 may be expressed as (1,3)=(1,0)+(1,1)+(1,2). The arrow 512 corresponds with check operation 5 of FIG. 4. The arrow 512 is a vertical arrow which touches all bits in the third vertical column. The parity constraint associated with arrow 512 may be expressed as (2,3)=(2,0)+(2,1)+(2,2). The arrow 514 corresponds with check operation 6 of FIG. 4. The arrow 514 is a vertical arrow which touches all bits in the fourth vertical column. The parity constraint associated with arrow 514 may be expressed as (3,3)=(3,0)+(3,1)+(3,2). The arrow 518 corresponds to check operation 7 of FIG. 4. The arrow 518 is a horizontal arrow which touches all bits in the fourth horizontal row. The parity condition associated with arrow 518 may be expressed as (3,3)=(0,3)+(1,3)+(2,3).

In this manner, information bits may be associated with positions at column-row intersections of a two-dimensional matrix. A position of the two-dimensional matrix not associated with an information bit may be associated with a constant bit (e.g., constant bit 516). Check bits may be calculated by forming an extra row and extra column of the two-dimensional matrix containing check bits. This method is an implementation of the more general mathematical expression described with reference to FIG. 2 and FIG. 3.

Accordingly, note two example methodologies have been described for encoding 8 information bits. The eight bits may be arranged in a 3×3 grid of rows and columns, leaving one position not associated with an information bit (e.g., empty). That position (e.g., bit position (2,0) in FIG. 3 and FIG. 5) may be filled with either a check bit (e.g., FIG. 3) or a constant bit (e.g., FIG. 4) to support generation of a check code having more check operations than check bits.

FIG. 6 is a parity check matrix representative of a check code arranged in accordance with examples described herein. The notation of the parity check matrix 600 of FIG. 6 is analogous to that of the parity check matrix 200 of FIG.

2. The parity check matrix 600 is representative of a check code which may be used by code generators described herein and may be stored and utilized by encoders and/or decoders described herein (e.g., encoder 102 and/or decoder 116 of FIG. 1). The parity check matrix 600 depicts an example where neither a constant bit nor an additional check bit has been inserted in the bit stream to achieve a check code having a greater number of check operations than check bits.

The code represented by parity check matrix 600 includes 16 information bits and 25 total bits Accordingly, 25 bits are shown in FIG. 6, corresponding to columns labeled B through Z. The bit stream for the encoded data is IIIICI-IIICIIIICIIIICCCCCC, where the Is refer to information bits and the Cs refer to check bits. The parity check matrix 600 may be referred to as depicting a code named 16-25, where the 16 refers to the number of information bits and 25 refers to the number of coded bits.

The parity check matrix 600 of FIG. 6 includes 10 check operations and 9 check bits. As with previously-described parity check matrices, each check operation is associated with a row and is in the rows denote which bits are used in the check operation. The shaded cells indicate that the check bit is calculated using a combination of other bits in the row.

The row weight is constant for all check operations of the parity check matrix 600. The column weight is constant for all bits of the parity check matrix 600. Other row and column weights may be used in other examples.

Figure 7:
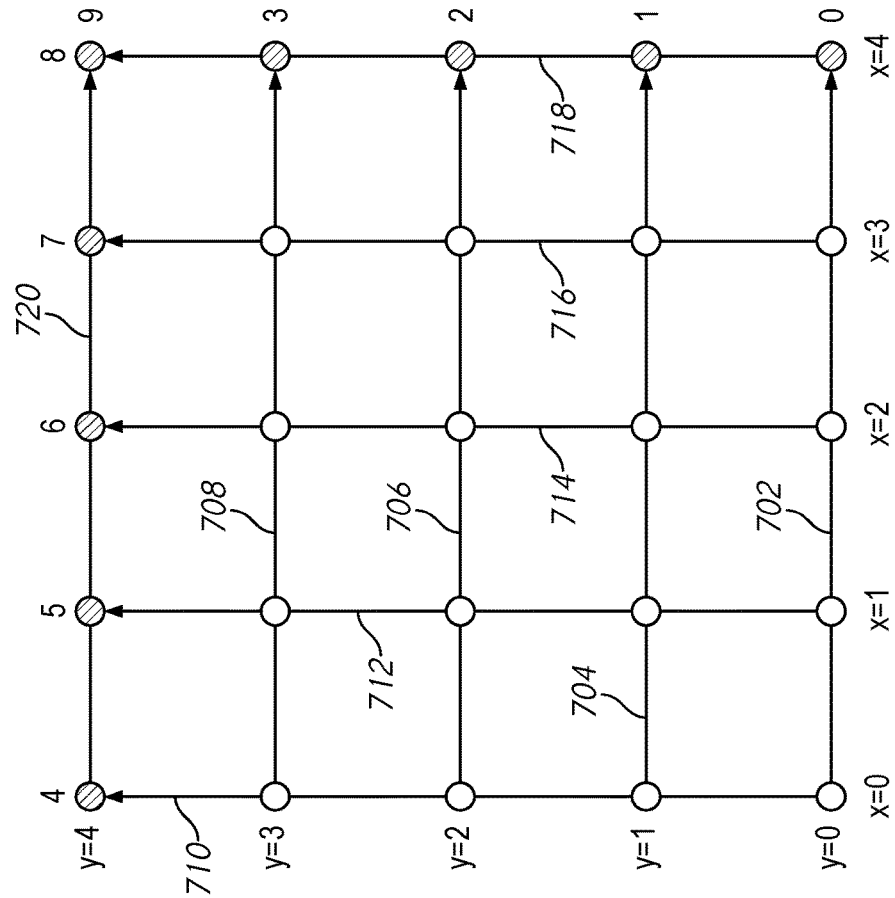
FIG. 7 is a graphical representation of a check code named herein 16-25 and arranged in accordance with examples described herein.

FIG. 7 is a graphical representation of a check code arranged in accordance with examples described herein. The graphical representation 700 may be a graphical representation of the check code also represented by parity check matrix 600 of FIG. 6. The notation used in FIG. 7 is analogous to that used and described with reference to the graphical representation 300 of FIG. 3. The graphical representation 700 is provided to aid in understanding how the check code may be generated (e.g., using an encoder, such as encoder 102 of FIG. 1). The check code represented in FIG. 7 is an LDPC code and may be referred to as a cubic LDPC code.

As with other graphical representations described herein, in the graphical representation 700, circles representative of bits are shown arranged in rows and columns. One bit is provided at each intersection of a row and a column (e.g., each position defined by a respective row and column). information bits are shown as open circles, while check bits are shown as shaded circles. The columns are each identified in FIG. 5 by a respective x coordinate ranging from 0 to 4. The rows are each identified in FIG. 3 by an y coordinate ranging from 0 to 4. The number of basic bits is $B=(5-1)\times(5-1)=16$. The total number of bits $T=5\times5=25$. The basic bits are the same as the information bits—there are no constant bits in this example.

In graphical representation 700, the information bits are arranged in rows and columns and fill out the grid from bit positions (0,0) to (3,3). An extra row of check bits is formed at y=4 in columns 0 through 4. An extra column of check bits is formed at x=4 in rows 0 through 4. The indices on the right-hand side and at the top of FIG. 7 refer to the check indices of FIG. 6 (e.g., the row number or check operation number). The arrow heads in FIG. 7 point to the check bits computed by the code generator (e.g., encoder) in that check operation. The bits are positioned in FIG. 7 according to their x,y coordinates given in FIG. 6. The bits touched by each arrow are used in that check operation to compute the check bit shown. Accordingly, arrow 702 corresponds with check operation 0 of FIG. 6, arrow 704 corresponds with check operation 1 of FIG. 6, arrow 706 corresponds with check operation 2 of FIG. 6, arrow 708 corresponds with check operation 3 of FIG. 6, arrow 710 corresponds with check operation 4 of FIG. 6, arrow 712 corresponds with check operation 5 of FIG. 6, arrow 714 corresponds with check operation 6 of FIG. 6, arrow 716 corresponds with check operation 7 of FIG. 6, arrow 718 corresponds with check operation 8 of FIG. 6, and arrow 720 corresponds with check operation 9 of FIG. 6.

FIG. 8 is a parity check matrix representative of a check code arranged in accordance with examples described herein. The parity check matrix 800 is analogous in notation and operation as parity check matrix 600, parity check matrix 400, and parity check matrix 200 described herein. The parity check matrix 800 is the next largest symmetric code—having 36 total bits and 25 basic bits. The 25 basic bits include 24 information bits and an additional check bit. The bit string, as shown in FIG. 8 is IIIICCIIIIICIIIIICI-IIIICIIIIICCCCCCC, with the Is representing information bits and the Cs representing check bits. Each row of the parity check matrix 800 corresponds to a check operation, and each column to a bit. The additional check bit is in column F. The column weights are not equal for all columns in the example of FIG. 8, but the row weights are equal for all rows, although this may vary in other examples. Note that there are 13 check operations and 12 check bits in this example. As before, the 1s in each row denote which bits are utilized in the check operation, and the shaded cells indicate which check bits are calculated by the combination of other bits in the row. The parity check matrix 800 may be referred to as depicting a code named 24-36c, where the 24 refers to the number of information bits, 36 refers to the number of coded bits, and c refers to the presence of an additional check bit.

Figure 9:
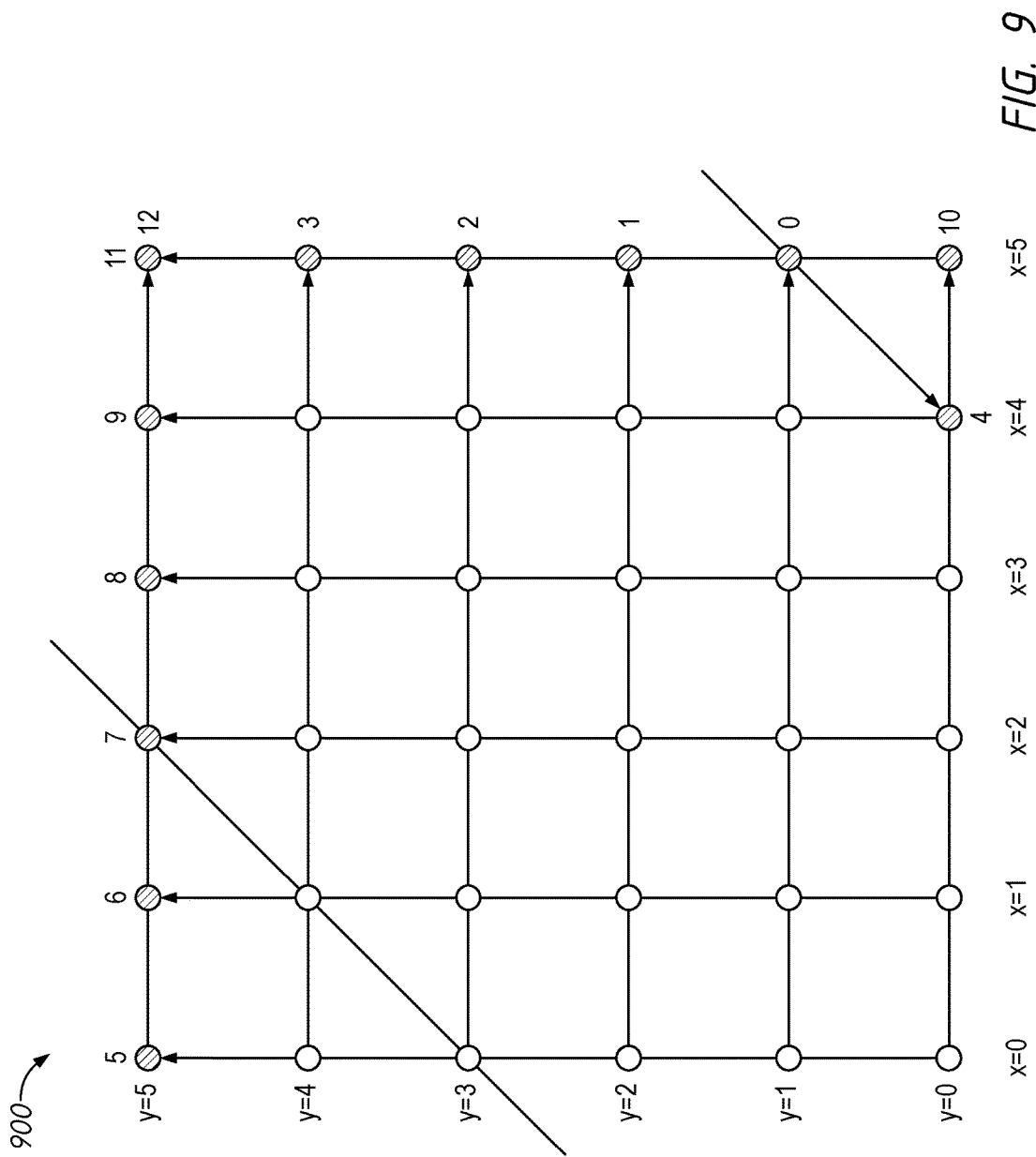
FIG. 9 is a graphical representation of a check code named herein 24-36c and arranged in accordance with examples described herein.

FIG. 9 is a graphical representation of a check code arranged in accordance with examples described herein. The graphical representation 900 may be a graphical representation of the check code also represented by parity check matrix 800 of FIG. 8. The notation used in FIG. 9 is and operates analogous to that used and described with reference to the graphical representation 700, graphical representation 500, and graphical representation 300 described herein.

As with other graphical representations described herein, in the graphical representation 900, circles representative of bits are shown arranged in rows and columns. One bit is provided at each intersection of a row and a column (e.g., each position defined by a respective row and column). Information bits are shown as open circles, while check bits are shown as shaded circles. The columns are each identified in FIG. 9 by a respective x coordinate ranging from 0 to 5. The rows are each identified in FIG. 9 by an y coordinate ranging from 0 to 5. The number of basic bits is $B=(6-1)\times(6-1)=25$. The total number of bits $T=6\times6=36$. The basic bits in this example include the information bits and an additional check bit provided at position (4,0).

In graphical representation 900, the information bits are arranged in rows and columns and fill out the grid from bit positions (0,0) to (4,4) with the exception of the position (4,0). An extra row of check bits is formed at y=5 in columns 0 through 5. An extra column of check bits is formed at x=5 in rows 0 through 5. An additional check bit is provided at (4,0). The indices on the right-hand side and at the top of FIG. 9 refer to the check indices of FIG. 8 (e.g., the row number or check operation number). The arrow heads in FIG. 9 point to the check bits computed by the code generator (e.g., encoder) in that check operation. The bits are positioned in FIG. 9 according to their x,y coordinates given in FIG. 8. The bits touched by each arrow are used in that check operation to compute the check bit shown. Note that a diagonal arrow is used to represent check operation 4 which calculates the additional check bit. Other diagonals may be used and the additional check bit placed in different locations in other examples.

Figure 10:
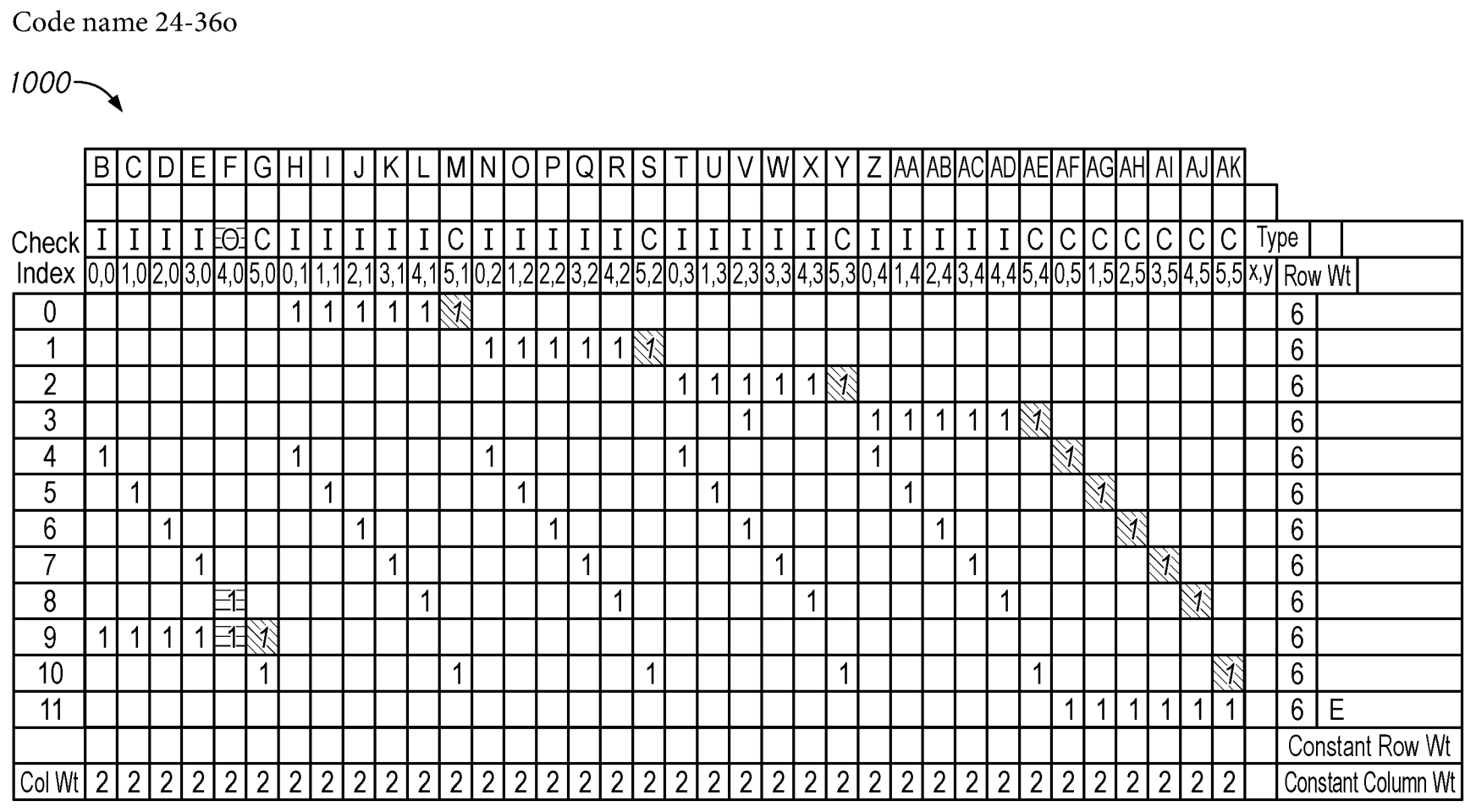

FIG. 10 is a parity check matrix representative of a check code arranged in accordance with examples described herein. The parity check matrix 1000 is analogous in notation and operation as parity check matrix 600, parity check matrix 400, and parity check matrix 200 described herein. The parity check matrix 1000 is further the same as parity check matrix 800 in size—having 36 total bits and 25 basic bits. However, the parity check matrix 1000 utilizes a constant bit at column F instead of the additional check bit of FIG. 8. The constant bit may be in other bit positions in other examples. The 25 basic bits include 24 information bits and 1 constant bit. The bit string, as shown in FIG. 10 is IIIIOCIIIIICIIIIICIIIIICIIIICCCCCCC, with the Is representing information bits and the Cs representing check bits, and 0 representing the constant bit. Each row of the parity check matrix 1000 corresponds to a check operation, and each column to a bit. The constant bit is in column F. The column weights are equal for all columns in the example of FIG. 10, and the row weights are equal for all rows, although this may vary in other examples. Note that there are 12 check operations and 11 check bits in this example. As before, the 1s in each row denote which bits are utilized in the check operation, and the shaded cells indicate which check bits are calculated by the combination of other bits in the row. The parity check matrix 1000 may be referred to as depicting a code named 24-36o, where the 24 refers to the number of information bits, 36 refers to the number of coded bits, and o refers to the use of a constant bit in the bit stream.

Figure 11:
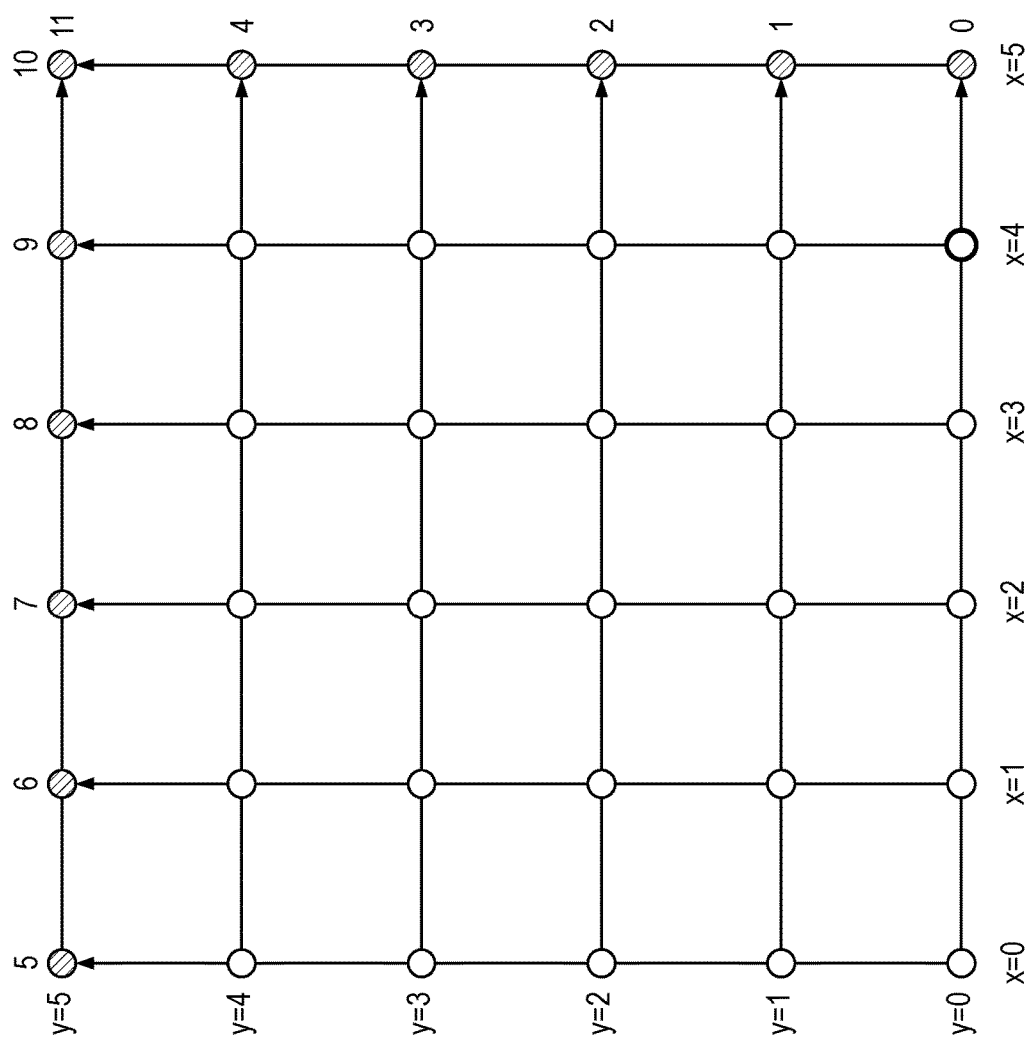
FIG. 11 is a graphical representation of a check code named herein 24-36o and arranged in accordance with examples described herein.

FIG. 11 is a graphical representation of a check code arranged in accordance with examples described herein. The graphical representation 1100 may be a graphical representation of the check code also represented by parity check matrix 1000 of FIG. 10. The notation used in FIG. 11 is and operates analogous to that used and described with reference to the graphical representation 900, graphical representation 700, graphical representation 500, and graphical representation 300 described herein.

As with other graphical representations described herein, in the graphical representation 1100, circles representative of bits are shown arranged in rows and columns. One bit is provided at each intersection of a row and a column (e.g., each position defined by a respective row and column). Information bits are shown as not bold open circles, while check bits are shown as shaded circles. In the example of graphical representation 1100, the constant bit is shown as a bold open circle. The columns are each identified in FIG. 11 by a respective x coordinate ranging from 0 to 5. The rows are each identified in FIG. 11 by any coordinate ranging from 0 to 5. The number of basic bits is $B=(6-1)\times(6-1)=25$. The total number of bits $T=6\times6=36$. The basic bits in this example include the information bits and a constant bit provided at position (4,0). The constant bit may be provided at other bit positions in other examples.

In graphical representation 1100, the information bits are arranged in rows and columns and fill out the grid from bit positions (0,0) to (4,4) with the exception of position (4,0). An extra row of check bits is formed at y=5 in columns 0 through 5. An extra column of check bits is formed at x=5 in rows 0 through 5. A constant bit is provided at position (4,0). The indices on the right-hand side and at the top of FIG. 11 refer to the check indices of FIG. 10 (e.g., the row number or check operation number). The arrow heads in FIG. 11 point to the check bits computed by the code generator (e.g., encoder) in that check operation. The bits are positioned in FIG. 11 according to their x,y coordinates given in FIG. 10. The bits touched by each arrow are used in that check operation to compute the check bit shown.

Figure 12:
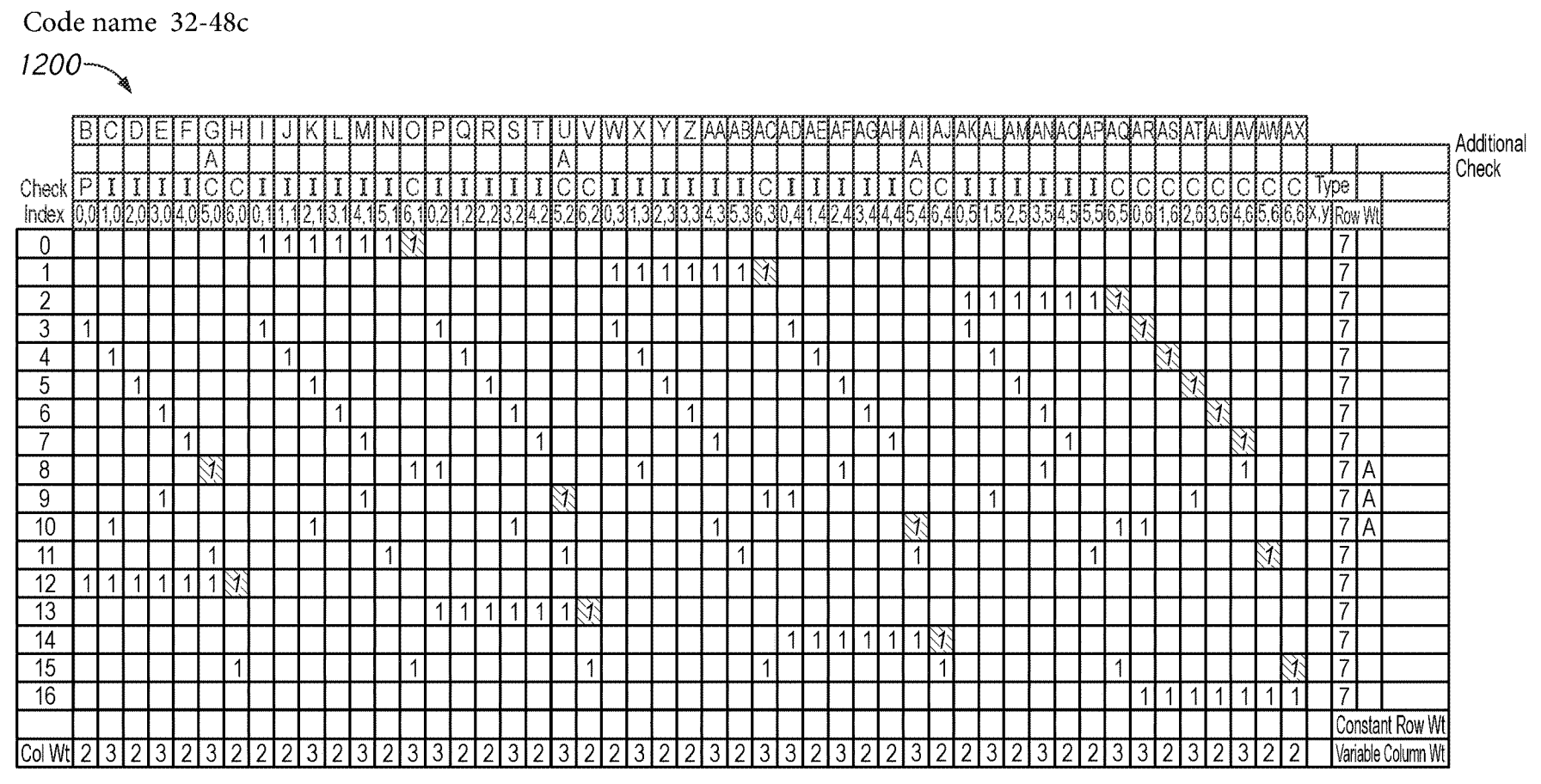

FIG. 12 is a parity check matrix representative of a check code arranged in accordance with examples described herein. The parity check matrix 1200 is analogous in notation and operation as parity check matrix 1000, parity check matrix 800, parity check matrix 600, parity check matrix 400, and parity check matrix 200 described herein. The parity check matrix 1200 is a next bigger sized symmetric code—having a total number of bits equaling 49 (e.g., 7×7). The basic bits are $B=(7-1)\times(7-1)=36$, however, in the example of parity check matrix 1200 one of the basic bits is a punctured bit and three are additional check bits. A punctured bit generally refers to a constant bit that is used in the parity check conditions, but it is not transmitted by transmitters described herein, nor is it received by receivers. Instead, the punctured bit has a position and a value known to both the transmitter and receiver (e.g., transmitter 124 of FIG. 1 and receiver 126 of FIG. 1). The identity and position of the punctured bit may, for example, be stored in check code memory 118 and/or check code memory 120 of FIG. 1. Given that the punctured bit is not transmitted, the code in parity check matrix 1200 may be referred to as a 32-48c code since 32 information bits are encoded in 48 coded bits (e.g., 49 total bits minus the one punctured bit), and c refers to the presence of additional check bits. The punctured bit is shown in column B of parity check matrix 1200, however, other locations may be used for the punctured bit. The bit string, as shown in FIG. 12 is PIIIICCIIIIICIIIIICCIIIIICI-IIIICCIIIIIICCCCCCCC, with the Is representing information bits and the Cs representing check bits, and the P representing the punctured bit. Each row of the parity check matrix 1200 corresponds to a check operation, and each column to a bit. The column weights are not equal for all columns in the example of FIG. 12, but the row weights are equal for all rows, although this may vary in other examples. Note that there are 17 check operations and 16 check bits in this example. As before, the 1s in each row denote which bits are utilized in the check operation, and the shaded cells indicate which check bits are calculated by the combination of other bits in the row. Variations of the parity check matrix 1200 may also be used, for example, as with the other parity check matrices shown herein, any arrangement of the rows (e.g., the check operations) may be used and may provide an equivalent check matrix.

Figure 13:
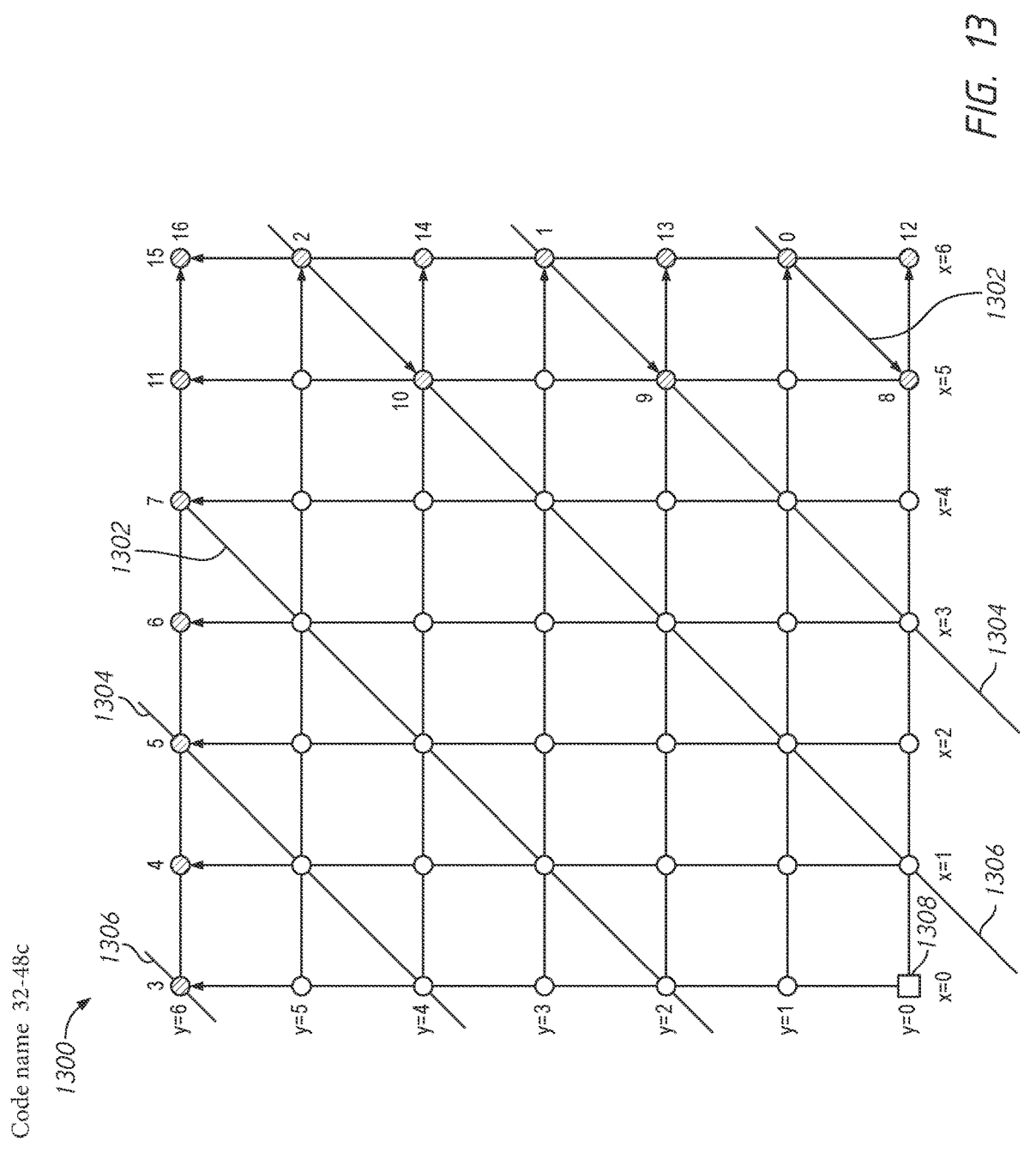

FIG. 13 is a graphical representation of a check code arranged in accordance with examples described herein. The graphical representation 1300 may be a graphical representation of the check code also represented by parity check matrix 1200 of FIG. 12. The notation used in FIG. 13 is and operates analogous to that used and described with reference to the graphical representation 1100, graphical representation 900, graphical representation 700, graphical representation 500, and graphical representation 300 described herein.

As with other graphical representations described herein, in the graphical representation 1300, circles and a square representative of bits are shown arranged in rows and columns. One bit is provided at each intersection of a row and a column (e.g., each position defined by a respective row and column). Information bits are shown as open circles, while check bits are shown as shaded circles. In the example of graphical representation 1300, the punctured bit 1308 is shown as a square. The columns are each identified in FIG. 13 by a respective x coordinate ranging from 0 to 6. The rows are each identified in FIG. 13 by any coordinate ranging from 0 to 6. The number of basic bits is B=(7−1)×(7−1)=36. The total number of bits T=7×7=49. The basic bits in this example include the 32 information bits, the 1 punctured bit 1308 [shown at bit position (0,0)], and the 3 additional check bits. The punctured bit and additional check bits may be provided at other bit positions in other examples.

In graphical representation 1300, the information bits are arranged in rows and columns and fill out the grid from bit positions (0,0) to (5,5) with the exception of position (0,0) which is the location of the punctured bit 1308 and the locations (5,0), (5,2) and (5,4) which are not associated with information bits but will be associated with additional check bits. An extra row of check bits is formed at y=6 in columns 0 through 6. An extra column of check bits is formed at x=6 in rows 0 through 6. The indices next to the bits in FIG. 13 refer to the check indices of FIG. 12 (e.g., the row number or check operation number). The arrow heads in FIG. 13 point to the check bits computed by the code generator (e.g., encoder) in that check operation. The bits are positioned in FIG. 13 according to their x,y coordinates given in FIG. 12. The bits touched by each arrow are used in that check operation to compute the check bit shown.

Note that three diagonal arrows are shown in FIG. 13, which correspond to checks used to calculate additional check bits at positions (5,0), (5,2) and (5,4). The diagonal arrows are broken into two pieces each in the diagram. The arrow 1302 is associated with check operation 8 and is used to calculate the check bit at bit position (5,0), the arrow 1304 is associated with check operation 9 and is used to calculate the check bit at position (5,2). The arrow 1306 is associated with check operation 10 and is used to calculate the check bit at position (5,4).

Figure 14:
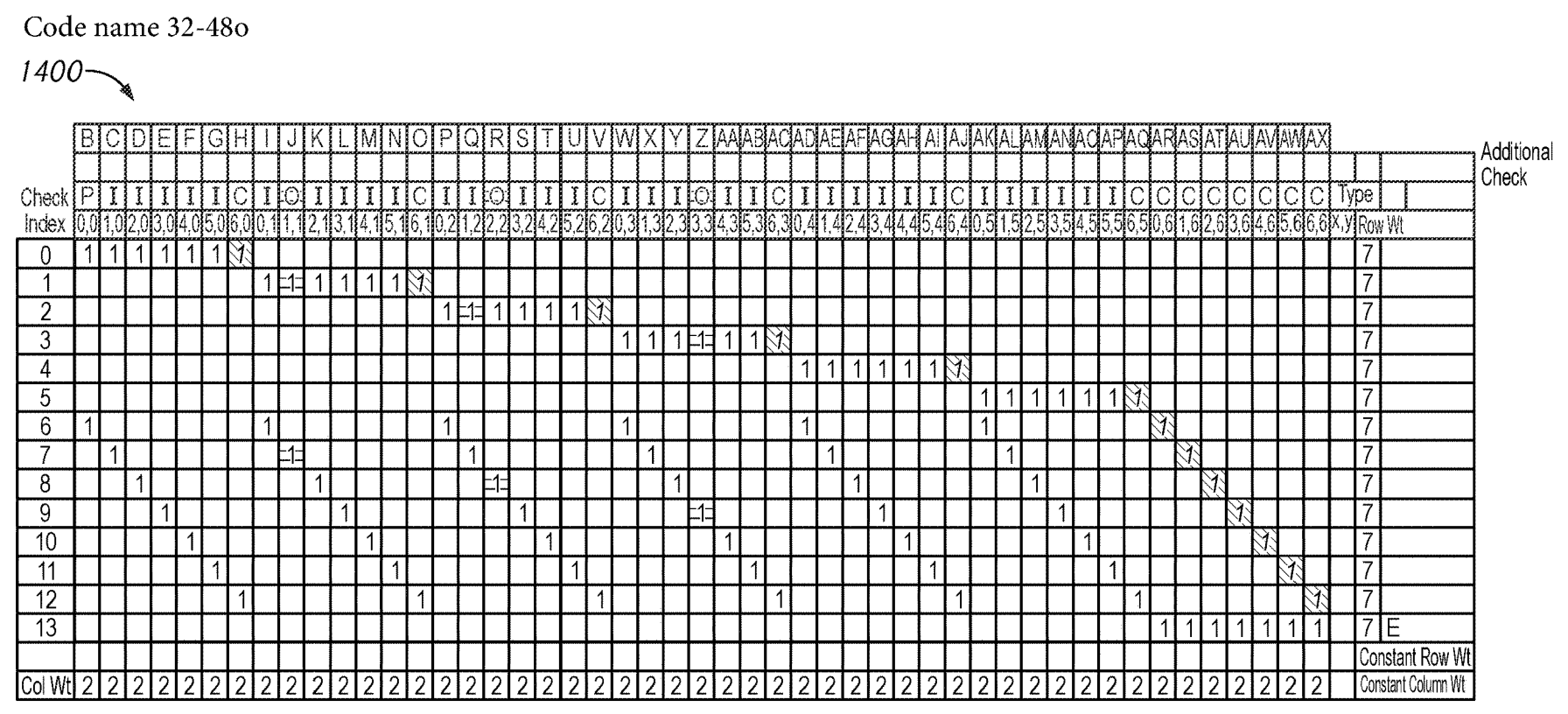

FIG. 14 is a parity check matrix representative of a check code arranged in accordance with examples described herein. The parity check matrix 1400 is analogous in notation and operation as parity check matrix 1200, parity check matrix 1000, parity check matrix 800, parity check matrix 600, parity check matrix 400, and parity check matrix 200 described herein. The parity check matrix 1400 is the same size as the parity check matrix 1200 and same configuration, except that instead of additional check bits, constant bits are used as described herein. The constant bits are positioned at columns J, R, and Z. The parity check matrix 1400 utilizes a punctured bit at column B as well, just as described with reference to parity check matrix 1200. Other locations may be used for the punctured bit. The bit string, as shown in FIG. 14 is PIIIIICIOIIICIIOIIICIIIOIICIIIIIICI-IIIIICCCCCCCC with the Is representing information bits and the Cs representing check bits, and the P representing the punctured bit, and the Os representing constant bits. Each row of the parity check matrix 1400 corresponds to a check operation, and each column to a bit. The column weights are equal for all columns in the example of FIG. 14, and the row weights are equal for all rows, although this may vary in other examples. Note that there are 14 check operations and 13 check bits in this example. As before, the 1s in each row denote which bits are utilized in the check operation, and the shaded cells indicate which check bits are calculated by the combination of other bits in the row. Variations of the parity check matrix 1400 may also be used, for example, as with the other parity check matrices shown herein, any permutation of the rows (e.g., the check operations) and/or columns may be used and may provide an equivalent check matrix. The parity check matrix 1400 may be referred to as depicting a code named 32-48o, where the 32 refers to the number of information bits, 48 refers to the number of coded bits, and o refers to the use of constant bits in the bit stream.

Figure 15:
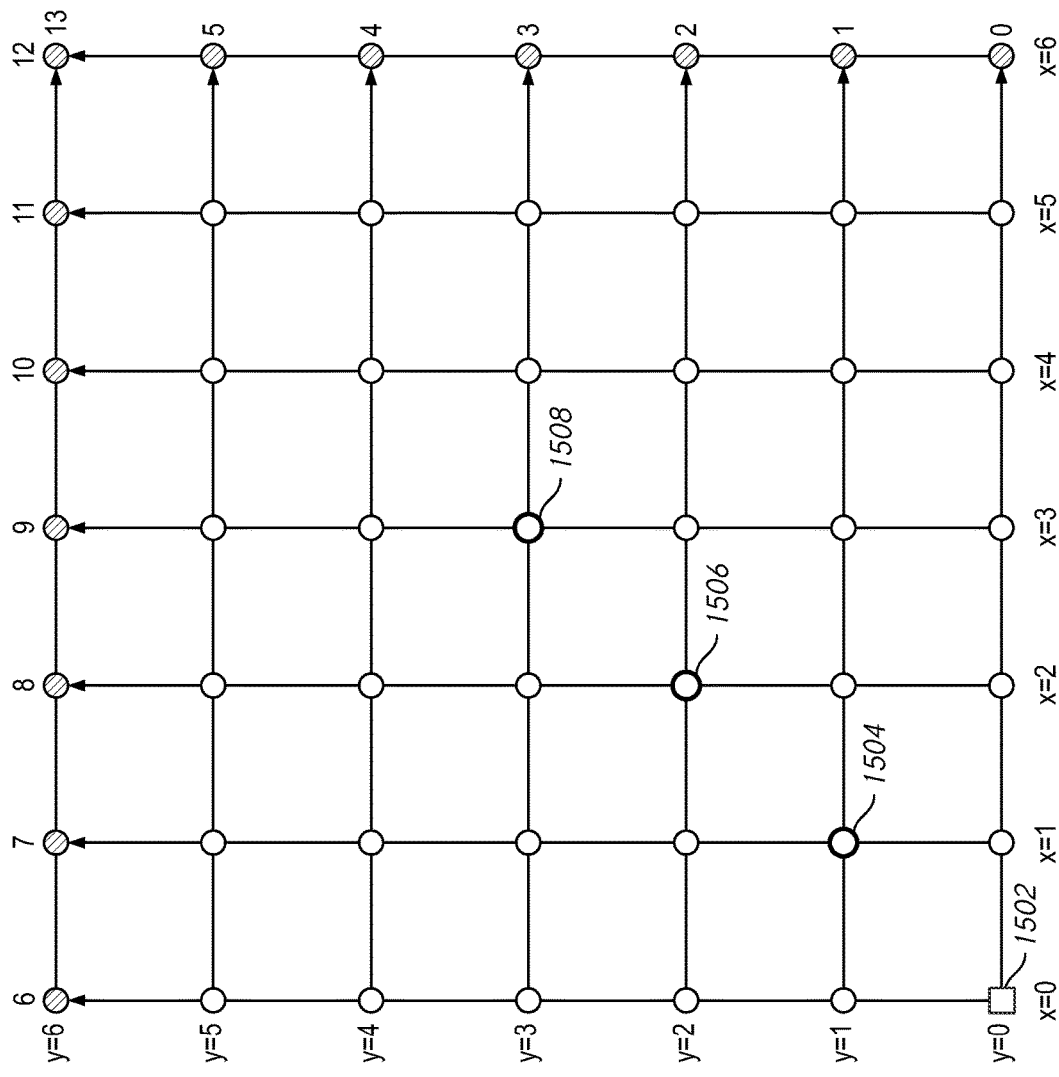
FIG. 15 is a graphical representation of a check code named herein 32-48o and arranged in accordance with examples described herein.

FIG. 15 is a graphical representation of a check code arranged in accordance with examples described herein. The graphical representation 1500 may be a graphical representation of the check code also represented by parity check matrix 1400 of FIG. 14. The notation used in FIG. 15 is and operates analogous to that used and described with reference to the graphical representation 1300, graphical representation 1100, graphical representation 900, graphical representation 700, graphical representation 500, and graphical representation 300 described herein.

As with other graphical representations described herein, in the graphical representation 1500, circles and a square representative of bits are shown arranged in rows and columns. One bit is provided at each intersection of a row and a column (e.g., each position defined by a respective row and column). Information bits are shown as not bold open circles, while check bits are shown as shaded circles. In the example of graphical representation 1500, the punctured bit 1502 is shown as a square. The columns are each identified in FIG. 15 by a respective x coordinate ranging from 0 to 6. The rows are each identified in FIG. 15 by any coordinate ranging from 0 to 6. The number of basic bits is B=(7−1)×(7−1)=36. The total number of bits T=7×7=49. The basic bits in this example include the 32 information bits, 3 constant bits, and the 1 punctured bit 1308, shown at bit position (0,0). The punctured bit may be provided at other bit positions in other examples. The constant bits are shown at bit positions (1,1), (2,2), and (3,3) although other locations may be used in other examples.

In graphical representation 1500, the information bits are arranged in rows and columns and fill out the grid from bit positions (0,0) to (5,5) with the exception of position (0,0) which is the location of the punctured bit 1308 and the locations (1,1), (2,2), and (3,3) which are constant bits. An extra row of check bits is formed at y=6 in columns 0 through 6. An extra column of check bits is formed at x=6 in rows 0 through 6. The indices on the right-hand side and at the top of FIG. 13 refer to the check indices of FIG. 14 (e.g., the row number or check operation number). The arrow heads in FIG. 15 point to the check bits computed by the code generator (e.g., encoder) in that check operation. The bits are positioned in FIG. 15 according to their x,y coordinates given in FIG. 14. The bits touched by each arrow are used in that check operation to compute the check bit shown.

The relationships between the numbers of basic bits, check bits, including additional check bits, and punctured bits as well as the code size (e.g., numbers of rows and columns in a two-dimensional matrix graphic representation) may be expressed mathematically.

Generally, for two-dimensional cubic LDPC codes having $N_x$ columns and $N_y$ rows, the total number of bits may be expressed as:

$$T = N_x N_y.$$

The number of code word bits, N, is equal to the total number of bits, T, less the number of punctured bits, P:

$$N = T - P.$$

Non-symmetric codes may provide more design flexibility when codes are required and/or desired to meet specific code word length requirements. Thus, width $N_x$, height $N_y$, and puncturing P can be selected to meet a desired code length N:

$$N=N_xN_y-P.$$

That is, the number of columns times the number of rows minus the number of punctured bits may equal the number of bits in the code.

There may be $N_x$ columns with a row weight of $N_y$, and $N_y$ rows with a row weight of $N_x$:

$$w_r=\{N_x,N_y\}.$$

For two-dimensional codes, examples described herein have row weights drawn from the set of $\{N_x, N_y\}$. The basic number of bits for a two-dimensional code B may be expressed as:

$$B=(N_x-1)(N_y-1).$$

For example, the number of bits may equal the product of the number of rows less one and the number of columns less one.

The number of checks for a two-dimensional cubic LDPC code M may be expressed as:

$$M=N_x+N_y+A,$$

where the number of checks equals the number of rows plus the number of columns plus a number of additional check bits.

For any dimension cubic LDPC code, the number of check bits C may be given as $$C=T-B+A_C.$$

So the number of check bits equals the total number of bits minus the number of basic bits plus the number of additional check bits, where Ac is the number of additional check bits.

The number of extra checks for a two-dimensional cubic LDPC code E may be expressed as:

$$E=M-C=1,$$

where the number of extra checks is equal to the number of checks minus the number of check bits. Typically, there is one more check operation than number of check bits for two-dimensional cubic LDPC codes.

For any dimension cubic LDPC code, the amount of puncturing, P, and additional bits, A (be they additional check bits or additional constant bits), may reduce the basic number of bits, B, down to the number of information bits, K:

$$K=B-P-A.$$

FIG. 16 is a parity check matrix representative of a check code arranged in accordance with examples described herein. The code represented by parity check matrix 1600 is not symmetric, with its graphical representation (in FIG. 17) having $N_x=4$ columns and $N_y=5$ rows for a total number of bits T=20 bits. Accordingly, non-symmetric codes may also be used in examples described herein. The example of parity check matrix 1600 may be referred to as a 12-20 code, having 12 information bits and 20 coded bits. The parity check matrix 1600 is analogous in notation and operation as parity check matrix 1400, parity check matrix 1200, parity check matrix 1000, parity check matrix 800, parity check matrix 600, parity check matrix 400, and parity check matrix 200 described herein. The bit string, as shown in FIG. 16 is IIICIIICIIICIIICCCCC, with the Is representing information bits and the Cs representing check bits. Each row of the parity check matrix 1600 corresponds to a check operation, and each column to a bit. The column weights are equal for all columns in the example of FIG. 16, but the row weights are not equal for all rows, although this may vary in other examples. Note that there are 9 check operations and 8 check bits in this example. As before, the 1s in each row denote which bits are utilized in the check operation, and the shaded cells indicate which check bits are calculated by the combination of other bits in the row.

Figure 17:
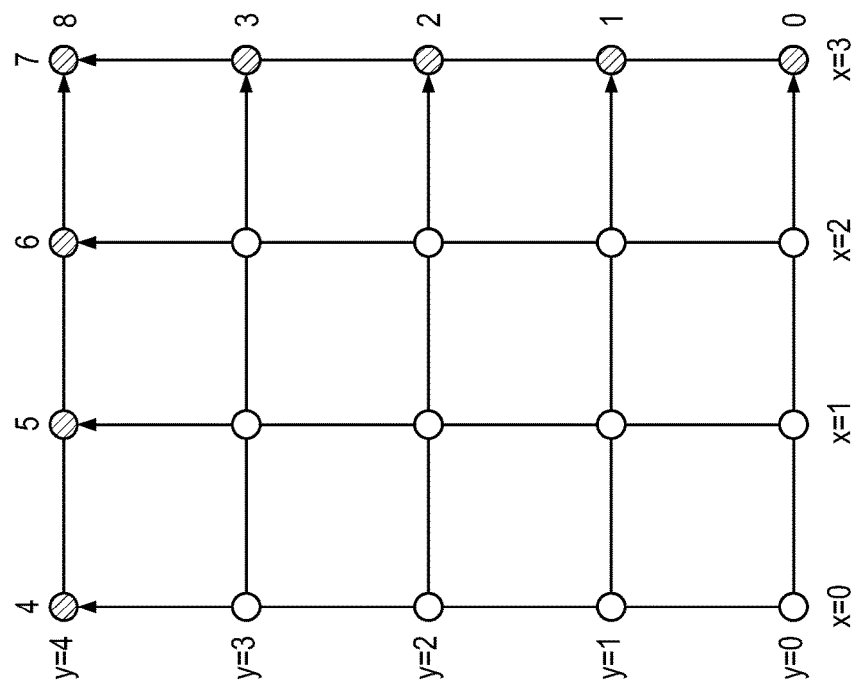
FIG. 17 is a graphical representation of a check code named herein 12-20 and arranged in accordance with examples described herein.

FIG. 17 is a graphical representation of a check code arranged in accordance with examples described herein. The graphical representation 1700 may be a graphical representation of the check code also represented by parity check matrix 1600 of FIG. 16. The notation used in FIG. 16 is and operates analogous to that used and described with reference to the graphical representation 1500, graphical representation 1300, graphical representation 1100, graphical representation 900, graphical representation 700, graphical representation 500, and graphical representation 300 described herein.

As with other graphical representations described herein, in the graphical representation 1700, circles representative of bits are shown arranged in rows and columns. One bit is provided at each intersection of a row and a column (e.g., each position defined by a respective row and column). Information bits are shown as open circles, while check bits are shown as shaded circles. In the example of graphical representation 1700, however, an unequal number of rows and columns are used. The columns are each identified in FIG. 17 by a respective x coordinate ranging from 0 to 3. The rows are each identified in FIG. 17 by any coordinate ranging from 0 to 4. This may be referred to as a 12-20 code because the number of information bits is K=3×4=12. The number of coded bits is N=4×5=20. The basic bits in this example include the information bits, filling the grid between (0,0) and (2,3) in this example.

An extra row of check bits is formed at y=4 in columns 0 through 3. An extra column of check bits is formed at x=3 in rows 0 through 4. The indices on the right-hand side and at the top of FIG. 17 refer to the check indices of FIG. 16 (e.g., the row number or check operation number). The arrow heads in FIG. 17 point to the check bits computed by the code generator (e.g., encoder) in that check operation. The bits are positioned in FIG. 17 according to their x,y coordinates given in FIG. 16. The bits touched by each arrow are used in that check operation to compute the check bit shown.

While a variety of two-dimensional codes have been described (e.g., represented by two-dimensional graphical representations of columns and rows), three-dimensional codes may also be used. The three-dimensional codes may be graphically represented by a three-dimensional grid in some examples.

As described herein, codes may be provided having a greater number of check operations than check bits. In some examples, the codes may have eight or more check operations than check bits (e.g., the number of check operations minus the number of check bits may be 8 or more). Other differentials between the number of check bits and check operations may also be used.

Figure 18:
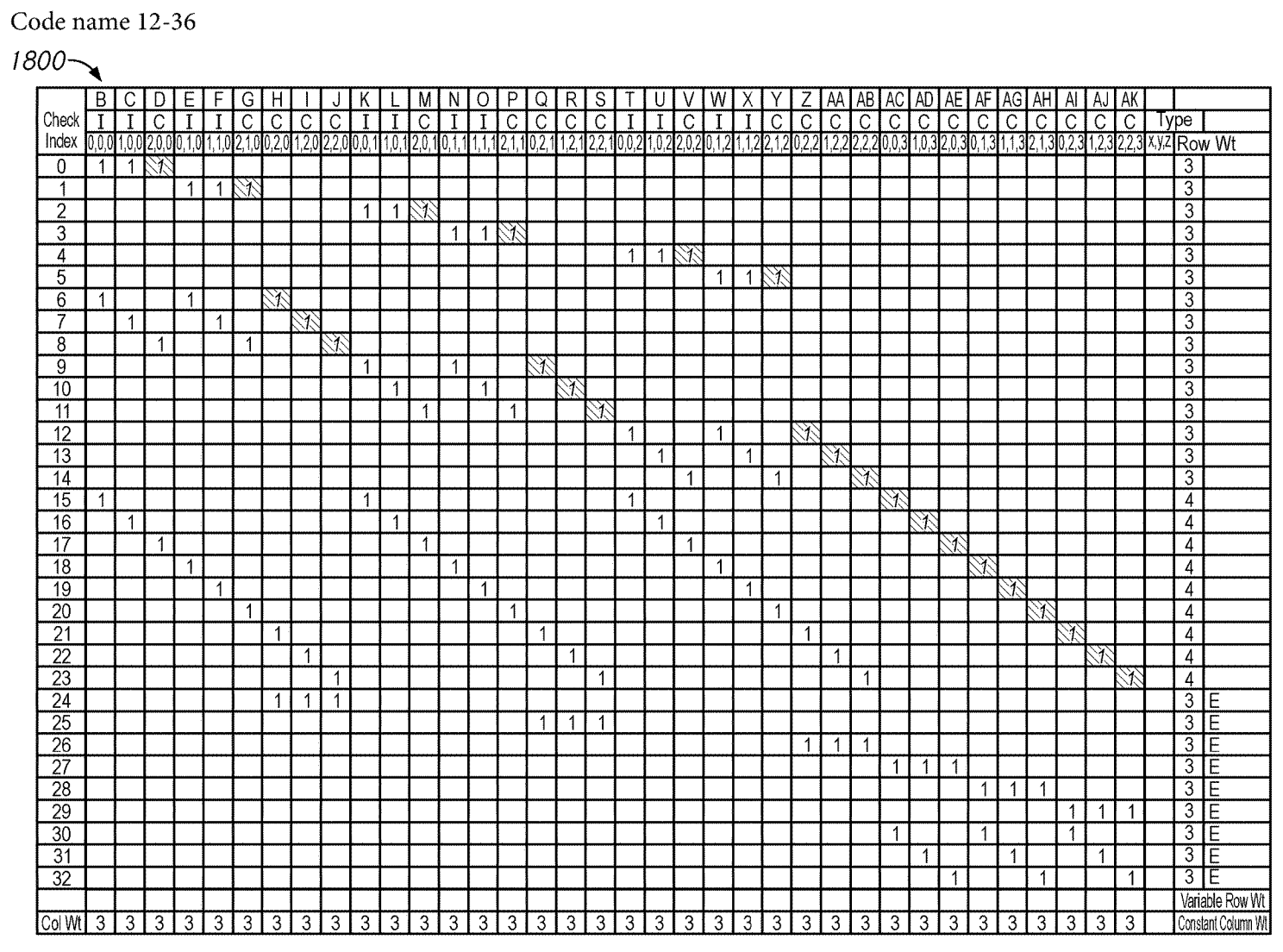

FIG. 18 is a parity check matrix representative of a check code arranged in accordance with examples described herein. The parity check matrix 1800 represents a three-dimensional check code, with its graphical representation (in FIG. 19) having three dimensions. The example of parity check matrix 1800 may be referred to as a 12-36 code, having 12 information bits and 36 coded bits. The parity check matrix 1800 is analogous in notation and operation as parity check matrix 1600, parity check matrix 1400, parity check matrix 1200, parity check matrix 1000, parity check matrix 800, parity check matrix 600, parity check matrix 400, and parity check matrix 200 described herein. The bit string, as shown in FIG. 18 is IICIICCCCIICIICCCCIICI-ICCCCCCCCCCCCC, with the Is representing information bits and the Cs representing check bits. Each row of the parity check matrix 1800 corresponds to a check operation, and each column to a bit. The column weights are equal for all columns in the example of FIG. 18, but the row weights are not equal for all rows, although this may vary in other examples. Note that there are 33 check operations and 24 check bits in this example. Accordingly, there are nine more check operations than check bits in the example code of FIG. 18. As before, the 1s in each row denote which bits are utilized in the check operation, and the shaded cells indicate which check bits are calculated by the combination of other bits in the row.

Analogous to the two-dimensional cubic LDPC codes, code generators (e.g., encoders) may compute check bits for a three-dimensional code in a recursive manner. The rule in choosing the sequence of computing check bits is to only compute a check bit if all of the bits that it depends on (the shaded bits in FIG. 18), have already been determined.

For three-dimensional cubic LDPC codes, the total number of bits T may be expressed as:

$$T = N_x N_y N_z.$$

where T is the product of the depth $N_x$, width $N_y$, and height $N_z$. The number of puncture bits P may be selected to meet a desired code length N:

$$N = T - P = N_x N_y N_z - P.$$

The code length N may equal the total number of bits T minus the punctured bits P. That expression may also equal to the product of the depth $N_x$, width $N_y$, and height $N_z$ minus the number of punctured bits. Other sizes of code lengths are possible in addition to those shown herein.

There may be $N_x N_z$ columns with a row weight of $N_y$, $N_y N_z$ ranks with a row weight of $N_x$ and $N_x N_y$ rows with a row weight of $N_z$:

$$w_r = \{N_x, N_y, N_z\}.$$

For three-dimensional codes, examples described herein have row weights drawn from the set of $\{N_x, N_y, N_z\}$. The basic number of bits for a three-dimensional code may be expressed as:

$$B = (N_x - 1)(N_y - 1)(N_z - 1),$$

where the number of basic bits is equal to the product of one less than the depth, one less than the height, and one less than the width.

The number of check operations for a three-dimensional cubic LDPC code may be expressed as:

$$M = N_x N_y + N_x N_z + N_y N_z + A_C.$$

So the number of check operations is equal to the sum of three products and the number of additional check bits Ac. The three products are the product of the depth and height, the product of the depth and width, and the product of the height and width. The number of extra check operations for a three-dimensional cubic LDPC code may be expressed as:

$$E = M - C = N_x + N_y + N_z - 1.$$

The number of extra check operations may be equal to the number of check operations minus the number of check bits C. That expression also may be equal to the sum of the height, width, and depth, minus 1. Note that the extra number of checks grows exponentially when progressing from two-, to three-, or to four-dimensional cubic LDPC codes. For $N_x = N_y = N_z = 3$, the smallest non-trivial three-dimensional cubic LDPC code, the number of extra check operations is 8.

Generally, examples of methods for generating coded bits for check codes (e.g., low-density parity-check codes) described herein may be expressed mathematically. The methods may include arranging basic bits (e.g., information bits and/or known or constant bits and/or additional check bits) in $N_x - 1$ ranks, $N_y - 1$ columns, and $N_z - 1$ rows of a three-dimensional matrix (although two-dimensional matrices may also be used). Methods may include calculating the $N_x$ rank as check bits, each of the check bits in the $N_x$ rank being the sum modulo 2 across ranks 1 to $N_x - 1$ for each combination of column y, $1 \leq y \leq N_y - 1$, and row z, $1 \leq z \leq N_z - 1$. The methods may further include calculating the $N_y$ column as check bits, each of the check bits in the $N_y$ column being the sum modulo 2 across columns 1 to $N_y - 1$ for each combination of rank x, $1 \leq x \leq N_x$, and row z, $1 \leq z \leq N_z - 1$. The methods may further include calculating the $N_z$ row as check bits, each of the check bits in the $N_z$ row being the sum modulo 2 across rows 1 to $N_z - 1$ for each combination of rank x, $1 \leq x \leq N_x$, and column y, $1 \leq y \leq N_y$. Other examples include different sequences of computing the check bits across the various dimensions.

Figure 19:
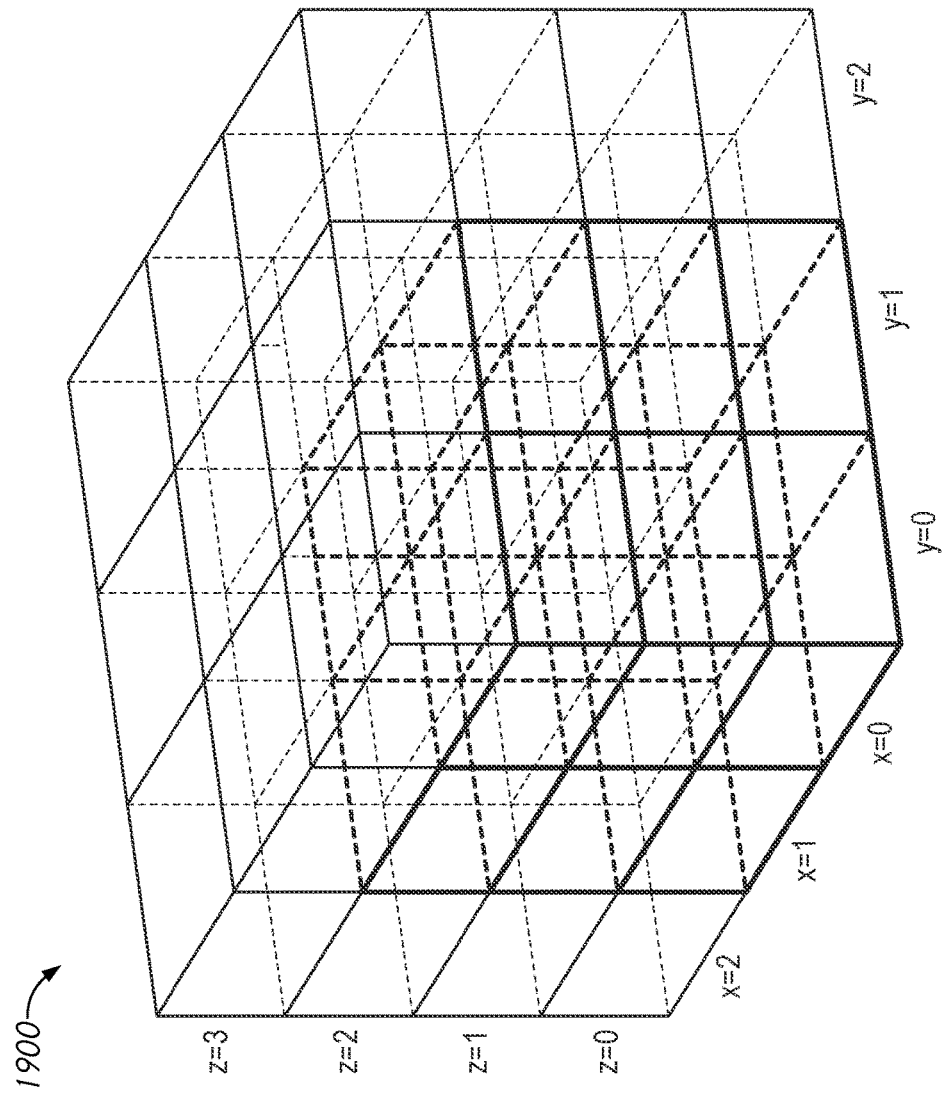
FIG. 19 is a graphical representation of a check code named herein 12-36 and arranged in accordance with examples described herein.

FIG. 19 is a graphical representation of a check code arranged in accordance with examples described herein. The graphical representation 1900 may be a graphical representation of the check code also represented by parity check matrix 1800 of FIG. 18. The information bits are located in the front left bottom corner of the cube. The check bits are located on the rear face, right face, and top face of the cube. The check bits on the rear face are formed as the x index is varied. For example, column D, check index 0 is (2,0,0)= (0,0,0)+(1,0,0), where a bit's position is identified as (x,y,z). The check bits on the right face are formed as they index is varied. For example, column E, check index 10, check bit (1,2,1)=(1,0,1)+(1,1,1). The check bits on the top face are formed as the z index is varied. For example, column AK, check index 23, check bit (2,2,3)=(2,2,0)+(2,2,1)+(2,2,2). The bits are positioned in accordance with their x,y,z position shown in FIG. 18.

The Hamming distance for three-dimensional cubic LDPC codes is 8 because there are 8 vertices of any rectangular cuboid within the 3×3×4 rectangular cuboid of FIG. 19. Suppose that the information bit at (0,0,0) changes value, then one cuboid which satisfies the parity checks, having all of its vertices toggle in value would be the one with vertices: (0,0,0), (2,0,0), (0,2,0), (2,2,0), (0,0,3), (2,0, 3), (0,2,3), and (2,2,3). For this example, the last 7 vertices are check bits. This can also be seen in FIG. 18 in which the bits in columns B, D, H, J, AC, AE, AI, and AK toggle. When column B toggles, then the checks, 0, 6, and 15, cause the bits in columns D, H and AC to toggle. When column D toggles, then the checks, 8 and 17, cause the bits in columns J and AE to toggle. When column H toggles, then the check 21, causes the bit in column AI to toggle. When column J toggles, then the check 23, causes the bit in column AK to toggle. Other examples are possible with various combinations of information bits and check bits, but they yield the same conclusion: a Hamming distance of 8.

A parity check matrix that has 2 bits in common between any two rows has a cycle length of 4 in its Tanner graph. A cycle length of 4 may in some examples be avoided when designing a parity check matrix since it decreases the independence between the two checks, a key attribute used by most LDPC decoders.

Starting with a parity check matrix having cycles greater than 4, a new parity check matrix may be designed by appending another check row which is the sum of two other rows. For example, consider adding check rows 0 and 1 of the 12-36 code of FIG. 18 to create a new check row 33.

$$z_0 = C_B + C_C + C_D$$

$$z_1 = C_E + C_F + C_G$$

$$Z_{33} = C_B + C_C + C_D + C_E + C_F + C_G$$

A disadvantage of appending such a row may be that the new row would have more than one bit in common with check row 0, and therefore would have a cycle length of 4.

The parity check matrices and LDPC decoders discussed herein may not have or use checks with 2 bits in common and therefore have a Tanner graph cycle length greater than 4. Furthermore, they also have more check operations than check bits while achieving a cycle length greater than 4.

The concept of additional check bits using diagonal paths such as 316 in FIG. 3 or 1302, 1304, or 1306 in FIG. 13 also applies to three-dimensional and four-dimensional cubic codes. Such diagonal paths through a three-dimensional matrix should not re-use any rank, row, or column more than once, otherwise the cycle length of the Tanner graph may be reduced. For each dimension, no more than one bit from each element of that dimension should be used in the check. As a result, the length of the diagonal path may be equal to the minimum taken across the dimensions of the matrix. The length of the diagonal path for additional check bits for two-dimensional cubic LDPC codes is $w_r = \min(N_x, N_y)$, for three-dimensional cubic LDPC codes is $w_r = \min(N_x, N_y, N_i)$, and for four-dimensional cubic LDPC codes is $w_r = \min(N_w, N_x, N_y, N_z)$.

Figure 20:
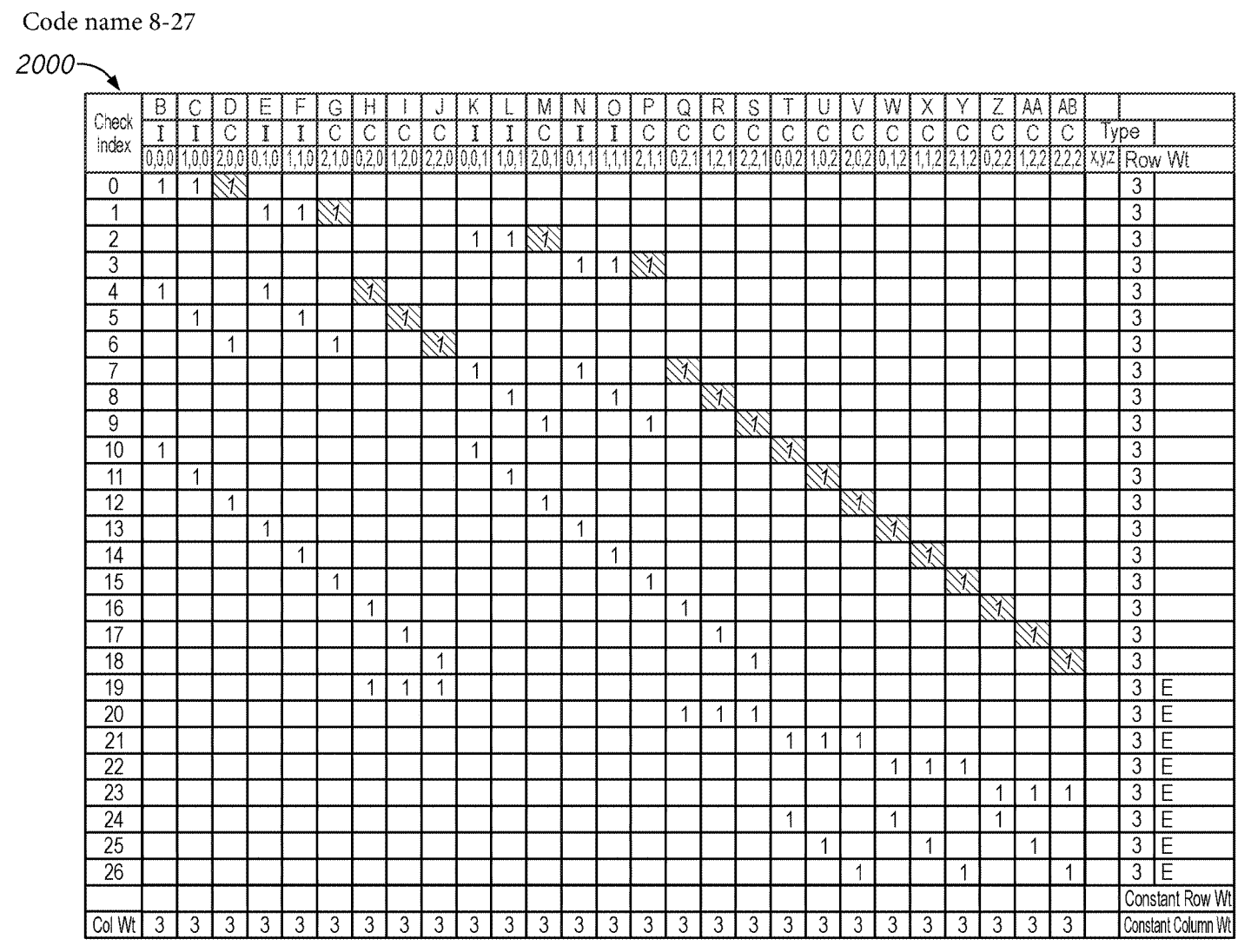

FIG. 20 is a parity check matrix representative of a check code arranged in accordance with examples described herein. The parity check matrix 2000 represents a three-dimensional check code, with its graphical representation (in FIG. 21) having three dimensions. The parity check matrix 2000 is a symmetric cubic code where the depth, height, and width all equal three. Larger values of the dimensions are also possible. The example of parity check matrix 2000 may be referred to as a 8-27 code, having 8 information bits and 27 coded bits. The parity check matrix 2000 is analogous in notation and operation as parity check matrix 1800 and other parity check matrices described herein. The bit string, as shown in FIG. 20 is IICIICCCCIICIICCCCCCCCCCCCC, with the Is representing information bits and the Cs representing check bits. Each row of the parity check matrix 2000 corresponds to a check operation, and each column to a bit. The column weights are equal for all columns in the example of FIG. 20, and the row weights are equal for all rows, although this may vary in other examples. Note that there are 27 check operations and 19 check bits in this example. Accordingly, there are eight more check operations than check bits in the code illustrated in FIG. 20. As before, the 1s in each row denote which bits are utilized in the check operation, and the shaded cells indicate which check bits are calculated by the combination of other bits in the row.

Figure 21:
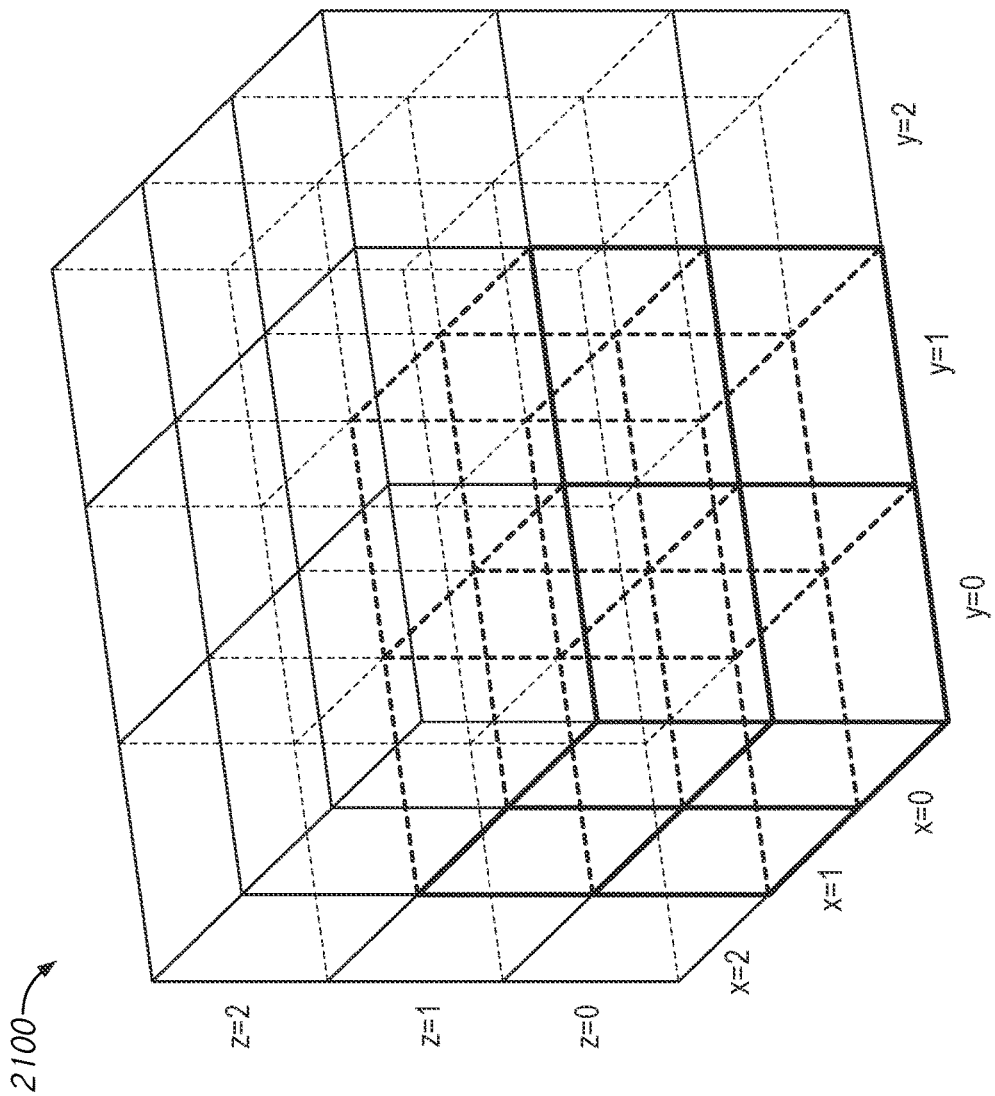
FIG. 21 is a graphical representation of a check code named herein 8-27 and arranged in accordance with examples described herein.

FIG. 21 is a graphical representation of a check code arranged in accordance with examples described herein. The graphical representation 2100 may be a graphical representation of the check code also represented by parity check matrix 2000 of FIG. 20. The information bits are located in the front left bottom corner of the cube. The check bits are located on the rear face, right face, and top face of the cube. The check bits on the rear face are formed as the x index is varied. The check bits on the top face are formed as the z index is varied. The check bits on the right face are formed as the y index is varied. The bits are positioned in accordance with their x,y,z position shown in FIG. 20.

Table 1 summarizes the implementations of code examples described herein. Other code sizes are possible. The first column is the name of the code with the first numeric value being the number of information bits, K, the second numeric value being the number of coded bits, N, and the suffix representing the type, Y, of additional bits: blank means no additional bits, c means the additional bits are check bits, and o means the additional bits are constant bits. For the first 8 codes, the number of information bits follows the pattern of 8n where n ranges from 1 to 4. A is the number of additional bits. The first 4 codes have additional check bits and the next 4 codes are similar to the first 4 but have additional constant bits instead of additional check bits. P is the number of punctured bits; the difference between the total bits and the code word bits. B is the number of basic bits and the first 8 codes have a symmetric geometric structure permitting B to be the square of an integer ranging between 3 and 6. T is the total number of bits (or columns) in the parity check matrix. The first 8 codes have a symmetric geometric structure permitting T to be the square of an integer ranging between 4 and 7. Of all the rectangles with the same area, T, a square has the smallest number of check bits and the largest number of basic bits. N is the number of coded bits, N=T−P that are communicated across the channel. C is the number of check bits and M is the number of checks (or rows) in the parity check matrix. $N_x$, $N_y$, and $N_z$ represent the geometric size of the cubic code. The code rate, R, is the ratio of number of information bits to the number of coded bits:

$$R = K/N$$

$w_r$ is the number of 1's in a row of the parity check matrix. $w_c$ is the number of 1's in a column of the parity check matrix. When there are no additional check bits, the column weight is 2 for two-dimensional cubic LDPC codes, 3 for three-dimensional cubic LDPC codes, and 4 for four-dimensional cubic LDPC codes.

TABLE 1

Summary of Cubic LDPC Code Examples.

| Name | Info bits K | Type Y | Add bits A | Punct Bits P | Basic bits B | Total bits T | Coded bits N | Check Bits C | Checks M | Side $N_x$ | $N_y$ | $N_z$ | Rate R | Row Wgt $w_r$ | Col Wgt $w_c$ |
|---|---|---|---|---|---|---|---|---|---|---|---|---|---|---|---|
| 8-16c | 8 | c | 1 | | 9 | 16 | 16 | 8 | 9 | 4 | 4 | | 0.500 | 4 | 2,3 |
| 16-25 | 16 | | | | 16 | 25 | 25 | 9 | 10 | 5 | 5 | | 0.640 | 5 | 2 |
| 24-36c | 24 | c | 1 | | 25 | 36 | 36 | 12 | 13 | 6 | 6 | | 0.667 | 6 | 2,3 |

TABLE 1-continued

Summary of Cubic LDPC Code Examples.

| Name | Info bits K | Type Y | Add bits A | Punct Bits P | Basic bits B | Total bits T | Coded bits N | Check Bits C | Checks M | Side $N_x$ | $N_y$ | $N_z$ | Rate R | Row Wgt $w_r$ | Col Wgt $w_c$ |
|---|---|---|---|---|---|---|---|---|---|---|---|---|---|---|---|
| 32-48c | 32 | c | 3 | 1 | 36 | 49 | 48 | 16 | 17 | 7 | 7 | | 0.667 | 7 | 2,3 |
| 8-16o | 8 | o | 1 | | 9 | 16 | 16 | 7 | 8 | 4 | 4 | | 0.500 | 4 | 2 |
| 16-25 | 16 | | | | 16 | 25 | 25 | 9 | 10 | 5 | 5 | | 0.640 | 5 | 2 |
| 24-36o | 24 | o | 1 | | 25 | 36 | 36 | 11 | 12 | 6 | 6 | | 0.667 | 6 | 2 |
| 32-48o | 32 | o | 3 | 1 | 36 | 49 | 48 | 13 | 14 | 7 | 7 | | 0.667 | 7 | 2 |
| 12-20 | 12 | | | | 12 | 20 | 20 | 8 | 9 | 4 | 5 | | 0.600 | 4,5 | 2 |
| 12-36 | 12 | | | | 12 | 36 | 36 | 24 | 33 | 3 | 3 | 4 | 0.333 | 3,4 | 3 |
| 8-27 | 8 | | | | 8 | 27 | 27 | 19 | 27 | 3 | 3 | 3 | 0.296 | 3 | 3 |

Encoders (e.g., code generators) described herein may be recursive and may sum $w_r-1$ bits to compute any check bit. This may reduce the complexity and implementation cost of the generator (e.g., encoder) compared to systems which may sum up to B bits to compute each check bit. The sequence of the check rows (e.g., check operations) may be selected to ensure computation of any check bits required by a subsequent check operation are calculated before the subsequent check operation is performed. If there are n check bits in a check, then n−1 of those check bits may have been computed in previous check operations and the remaining check bit may be computed in the current check operation.

Examples of decoders (e.g., LDPC decoders) described herein may use 8 or more checks than check bits which may permit the decoder to achieve a lower message error rate than other systems having the number of checks 7 or less than the number of check bits.

Examples described herein may use additional bits that are either check bits or constant bits. Additional bits along with 2, 3, or 4 dimensional codes, edge lengths ($N_x$, $N_y$, Ni), and puncture bits may allow for the design of cubic LDPC codes with a desired code word length and/or a desired number of information bits.

Accordingly, examples described herein include a systematic method of increasing the number of rows in the parity check matrix. A geometrical interpretation of a $w_c=2$ code as a two-dimensional rectangle or a $w_c=3$ code as a three-dimensional rectangular cuboid is described.

Check codes and methods for generating check codes described herein may be used in a variety of communication systems. As described generally with respect to FIG. 1, encoders and decoders may utilize parity check codes described herein to encode information bits into a bitstream and to decode information bits from a received bitstream.

Figure 22:
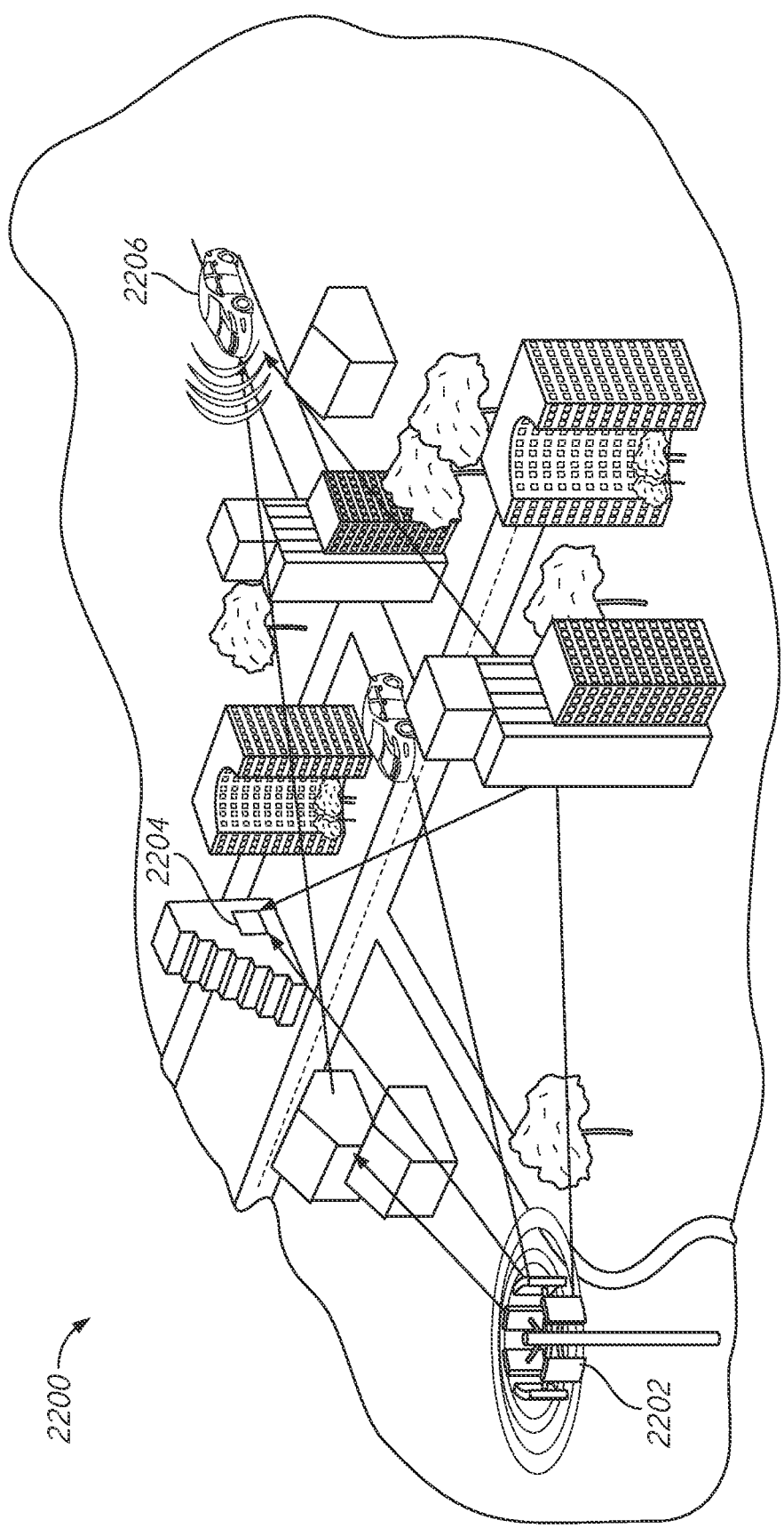
FIG. 22 is a schematic illustration of a communication system arranged in accordance with examples described herein.

FIG. 22 is a schematic illustration of a communication system arranged in accordance with examples described herein. The communication system 2200 of FIG. 22 includes a base node 2202 and one or more consumer nodes, such as consumer node 2204 and consumer node 2206. Generally, data may be communicated between the base node 2202 and the one or more consumer nodes (e.g., consumer node 2204 and/or consumer node 2206) using techniques described herein. For example, data may be encoded and/or decoded at either the base node, the consumer node, or both, using check codes described herein. Either the base node, the consumer node, or both, may generate check codes using methods described herein. For example, each base node and consumer node may include one or more encoder(s) and/or decoder(s) as described herein.

Base nodes may be implemented, for example, using an antenna array, filters, digital signal processor(s), one or more network switches (e.g., Ethernet switches), and/or other electronic components. Base nodes may include encoders and decoders as described herein. The base node 2202 may be in communication (e.g., wired communication using fiber, cables, wires, etc.) with a network, such as the Internet. A base node, such as base node 2202 may be positioned in an environment to provide wireless communication services (e.g., Internet connectivity) to multiple consumer nodes within communication distance of the base node. Base nodes may include an adaptive antenna array, which may collect and/or transmit incident energy from and/or to multiple simultaneous. Base nodes described herein can receive and process multiple simultaneous beams because the system is able to perform extreme interference cancellation to eliminate interference between the various consumer node signals. For example, consumer nodes described herein may direct spatial nulls in the array antenna pattern in the directions of all interfering consumer nodes while forming a beam peak in the direction of the desired consumer node. This process may be replicated for each desired consumer node in communication with the base node, thus forming multiple beams and mutual spatial nulling that cancels interference.

Consumer nodes may be implemented, for example, using one or more antennas, filters, digital signal processor(s), and may include encoders and/or decoders as described herein. Consumer nodes may be placed, for example, on residential or commercial buildings (such as consumer node 2204). A consumer node may be coupled to a wired connection (e.g., an Ethernet cable) and may provide Internet services to a residence, company, or other occupants of the building. In an analogous manner, a consumer node (such as consumer node 2206) may be provided in a mobile device (e.g., an automobile, train, bus, helicopter, aircraft, boat, tablet, or phone). The mobile device may receive Internet services through communication with the base node 2202. In some examples, one or more consumer nodes may be located adjacent and/or coupled to a picocell and may provide a connection between the picocell and the network as a backhaul network. For example, a wireless backhaul described herein may be used to connect wireless base stations to the core network and/or the operator's point-of-presence and facilitates the backhaul connection of all types of base stations, including femto, pico, micro, mini, and macro base stations. In some examples, communication systems described herein may be used for wireless broadband bridging and last mile extensions of copper, cable and/or fiber plant.

In some examples, the communication system 2200 may be a non-line-of-sight system. In some examples, the non-line-of-sight system may be a multipoint backhaul system, which may be implemented using a star architecture. Accordingly, each receiver (e.g., receivers in the base node 2202 and/or consumer nodes) may receive multiple multipath versions of transmitted data as the signals are propagated off of obstructions in the environment (e.g., other buildings, trees, vehicles, etc.). The communication system 2200 may operate at frequencies intended for use in non-line-of-sight systems, such as frequencies below 7 GHz. The communication system 2200 may operate at, for example, 5.1 GHz and/or 5.8 GHz which are unlicensed spectrum bands in the U.S. Operating at that frequency generally refers to transmitting and/or receiving by the base node and/or consumer nodes at the specified frequencies.

An example communication system described herein may support a number of links, e.g., L links, where each link generally includes a consumer node and a base node. Each base node may support multiple links, and any number of base nodes may be present in a system. Each link may have a data capacity, expressed as Q million bits per second (Mbps) where Q generally ranges up to 784 Mbps, although other capacities may be used. Accordingly, a data capacity at a base node may be LQ, if L is the number of simultaneous links supported by the base node where L may be up to 3 for a Q of 784 Mbps.

Generally, a link may include a shared adaptive antenna array at the base node and one or more directional antennas and/or antenna arrays at the consumer node participating in the link. Base nodes described herein may utilize beamforming techniques which may facilitate performance of communication systems. Consumer nodes having antenna arrays may also utilize beamforming techniques which may facilitate the performance of the system. For example, one or more consumer nodes may calculate beamforming weights for their antenna array(s) using data, such as a frame start preamble (FSP), of the base node as a reference. Weights may be computed, for example, from the Weiner equation using the array covariance matrix and the cross-correlation of the data with the FSP. Alternately, known reference symbols in the base node may be used instead of the FSP as the desired signal. In communication systems described herein, the base node may self align its antenna pattern to some or all of the consumer nodes. When adaptive arrays are used in both the base nodes and consumer nodes, adaptive arrays may be arranged to maximize the signal-to-interference and noise ratio (SINR) by, for example, pointing an antenna beam toward the other end of the link, and by reducing interference by directing spatial nulls of the array toward these sources of link degradation. Accordingly, base nodes and/or consumer nodes described herein may utilize beamforming techniques to direct spatial nulls toward sources of link degradation (e.g., other consumer nodes in the communication system).

Figure 23:
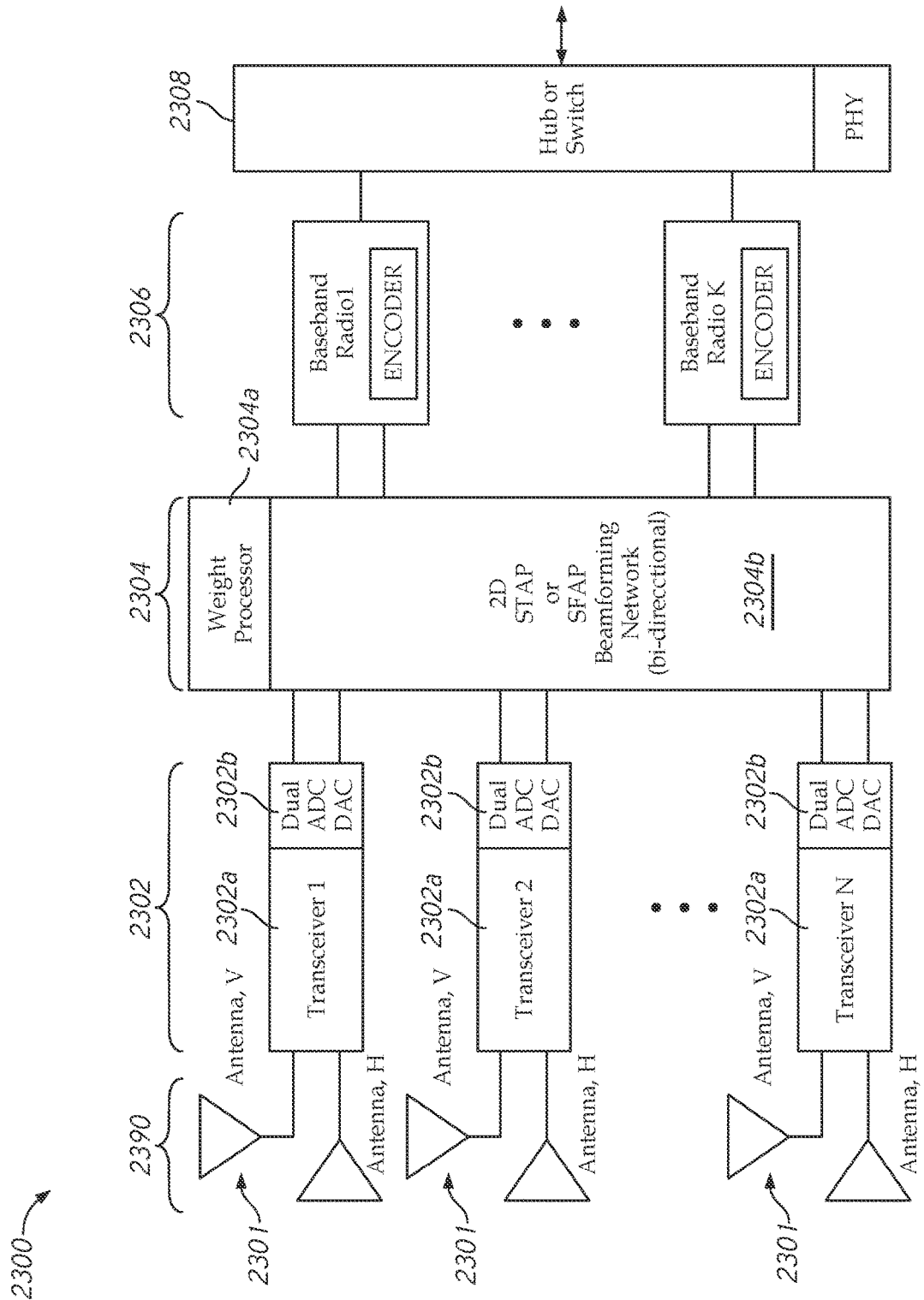
FIG. 23 is a schematic illustration of a base node and/or consumer node in accordance with examples described herein.

FIG. 23 is a schematic illustration of a base node and/or consumer node in accordance with examples described herein. The node 2300 of FIG. 23 may be used to implement either a base node (e.g., base node 2202 of FIG. 22) and/or a consumer node (e.g., consumer nodes 2204 and/or 2206 of FIG. 22). The node 2300 may include four subsystems including an antenna subsystem 2390, a transceiver subsystem 2302, a beamforming subsystem 2304, such as a 2-dimensional beamforming system, and a baseband radio subsystem 2306.

The antenna subsystem 2390 may include a plurality of antennas 2301, which may generally include any number of antennas in an adaptive array for a consumer node and/or base node. Each antenna may have 2 feed points that are orthogonal (or quasi-orthogonal). For example, the orthogonal (or quasi-orthogonal) feed points may be vertical/horizontal, left-hand-circular/right-hand-circular, or slant left/slant right as examples. The vertical/horizontal (V/H) feed points for each antenna are shown in FIG. 23. Each antenna may be passive or active. The antennas can be arrayed in a linear array, a two dimensional array or a 3-dimensional array, or in any other arrangement. Example geometries of the antennas include flat panel, circular, semi-circular, square or cubic implementations. The antennas maybe placed in the array in an arbitrary fashion as well.

The transceiver subsystem 2302 may include a plurality of transceivers 2302a, such as a number of transceivers for a base node and/or a consumer node that provide one channel for each of the 2 polarization feeds from the associated antenna as shown in FIG. 23. Each transceiver channel provides a radio frequency (RF) receiver and an RF transmitter. Each transmitter may implement the up-converter and amplifier 106 of FIG. 1. Each receiver may implement the amplifier and down-converter 112 of FIG. 1. Each transceiver 2302a provides coherent or quasi-coherent down-conversion and up-conversion between RF and a complex baseband.

Each RF receiver in each transceiver may include a preselection filter, a low noise amplifier, a down-converting mixer, low pass filter and/or a local oscillator to convert the RF signal down to the complex baseband. The complex baseband may be converted to digital in-phase and quadrature signals using two analog-to-digital converters in a converter unit 2302b.

Each RF transmitter in each transceiver may include two digital-to-analog converters in the converter unit 2302b, two low pass filters, and an up-converting mixer fed by a local oscillator (LO) to convert the baseband signal to RF. In some examples, the LO can be shared between the receiver and the transmitter. The output of the up-converting mixer drives an RF preamplifier, power amplifier, and transmit filter completing the transmitter. The transmitter and receiver may be connected to the antenna feed via a transmit-receive switch or a diplexing filter.

The beamforming subsystem 2304 may receive the signals from each of the transceivers as shown in FIG. 23. The beamforming subsystem may have a weight processor 2304a and a beamforming network (BFN) 2304b that may be implemented using a processor to perform the beamforming processes. In some examples, a two dimensional (2D) space-time adaptive processing (STAP) or space-frequency adaptive processing (SFAP) bidirectional beam forming network may be used. The beamforming subsystem 2304 may also be connected to the baseband radio subsystem 2306 that has a plurality of baseband radios (e.g., 1 to K in FIG. 23) that are coupled to a hub or switch to route the data traffic.

Physical (PHY) control channels communicate PHY information from the transmitter to the receiver. PHY information may include the modulation and coding scheme for payload channels, timing error, frequency error, received signal strength, etc.

During the transmit subframe, each baseband radio accepts information bits from the hub or switch 2308 or from a PHY control channel and encodes the information bits. Accordingly, each baseband radio may include an encoder, and may be implemented, for example using encoder 102 of FIG. 1. Each baseband radio may modulate the encoded bits (e.g., using a modulator such as modulator 104 of FIG. 1), and forward the modulated waveforms to the beamformer 2304b. During the receive subframe, each baseband radio may accept waveforms from the beamformer 2304b and demodulates the waveforms (e.g., using a demodulator such as demodulator 114 of FIG. 1). The baseband radios may decode the demodulated data (e.g., using a decoder such as the decoder 116 of FIG. 1), and forward the recovered information bits to the PHY or to the hub or switch 2308.

Stored parity check codes may be in memory accessible to the baseband radios shown in FIG. 23 for use by encoders and/or decoders in the baseband radios. The memory may be shared among one or more of the baseband radios or the parity check code for use by one or more of the baseband radios may be stored separately.

From the foregoing it will be appreciated that, although specific embodiments have been described herein for purposes of illustration, various modifications may be made while remaining with the scope of the claimed technology.

Examples described herein may refer to various components as "coupled" or signals as being "provided to" or "received from" certain components. It is to be understood that in some examples the components are directly coupled one to another, while in other examples the components are coupled with intervening components disposed between them. Similarly, signals may be provided directly to and/or received directly from the recited components without intervening components, but also may be provided to and/or received from the certain components through intervening components.

What is claimed is:

1. A method for creating a low-density parity-check code (LDPC) using an encoder and a decoder, the method comprising:
    positioning, using the encoder, coded bits comprising information bits, 0 or more constant bits, and check bits in a three-dimensional matrix having ranks, columns, and rows; and
    calculating, using the encoder, the check bits such that a modulo-2 sum across the ranks of all combinations of columns and rows, and across the columns of all combinations of ranks and rows, and across the rows of all combinations of ranks and columns is 0; and
    using the decoder, and based at least on the LDPC, performing error correction in a communication system.

2. The method of claim 1, wherein the three-dimensional matrix includes basic bits arranged in Nx−1 ranks, Ny−1 columns, and Nz−1 rows of a three-dimensional matrix;
    wherein an Nx rank includes check bits, each of the check bits in the Nx rank being the sum modulo 2 across ranks 1 to Nx−1 for each combination of column y, $1 \leq y \leq Ny-1$, and row z, $1 \leq z \leq Nz-1$;
    wherein an Ny column includes check bits, each of the check bits in the Ny column being the sum modulo 2 across columns 1 to Ny−1 for each combination of rank x, $1 \leq x \leq Nx$, and row z, $1 \leq z \leq Nz-1$; and
    wherein an Nz row includes check bits, each of the check bits in the Nz row being the sum modulo 2 across rows 1 to Nz−1 for each combination of rank x, $1 \leq x \leq Nx$, and column y, $1 \leq y \leq Ny$.

3. The method of claim 2, wherein the basic bits comprise the information bits, 0 or more constant bits, additional check bits, or combinations thereof.

4. The method of claim 1, wherein values of the check bits are further calculated such that the modulo-2 sum across one or more paths through the matrix is 0, a length of each path being equal to a minimum of the number of ranks, columns, and rows; and
    each bit of the path not having a same rank as any other bit of the path;
    each bit of the path not having a same column as any other bit of the path; and
    each bit of the path not having a same row as any other bit of the path.

5. The method of claim 4, wherein at least one position defined by a selected rank and a selected row and a selected column is not associated with an information bit, and wherein the method further comprises calculating a check bit for the at least one position using bits located at a diagonal pattern of ranks, columns, and rows.

6. The method of claim 5, wherein multiple positions defined by certain rank and certain row and column combinations are not associated with any information bit but are associated with check bits.

7. The method of claim 6, further comprising calculating multiple check bits of the multiple positions using bits at respective diagonal patterns of ranks, columns, and rows.

8. A method for creating a low-density parity-check code (LDPC) using an encoder and a decoder by:
    positioning, using the encoder, coded bits comprising information bits, 0 or more constant bits, and check bits in a four-dimensional matrix having files, ranks, columns, and rows; and
    calculating, using the encoder, the check bits such that a modulo-2 sum across the files of all combinations of ranks, columns, and rows, across the ranks of all combinations of files, columns, and rows, across the columns of all combinations of files, ranks, and rows, and across the rows of all combinations of files, ranks, and columns is 0; and
    using the decoder, and based at least on the LDPC, performing error correction in a communication system.

9. The method of claim 8, wherein the four-dimensional matrix includes basic bits arranged in Nw−1 files, Nx−1 ranks, Ny−1 columns, and Nz−1 rows of a four-dimensional matrix;
    wherein an Nw file includes check bits, each of the check bits in the Nw file being the sum modulo 2 across files 1 to Nw−1 for each combination of rank x, $1 \leq x \leq Nx-1$, column y, $1 \leq y \leq Ny-1$, and row z, $1 \leq z \leq Nz-1$;
    wherein an Nx rank includes check bits, each of the check bits in the Nx rank being the sum modulo 2 across ranks 1 To Nx−1 for each combination of file w, $1 \leq w \leq Nw$, column y, $1 < y < Ny-1$, and row z, $1 \leq z \leq Nz-1$;
    wherein an Ny column includes checkbits, each of the check bits in the Ny column being the sum modulo 2 across columns 1 to Ny−1 for each combination of file w, $1 \leq w \leq Nw$, rank x, $1 \leq x \leq Nx$, and row z, $1 \leq z \leq Nz-1$; and
    wherein an Nz row includes checkbits, each of the check bits in the Nz row being the sum modulo 2 across rows 1 to Nz−1 for each combination of file w, $1 \leq w \leq Nw$, rank x, $1 \leq x \leq Nx$, and column y, $1 \leq y \leq Ny$.

10. The method of claim 9, wherein the basic bits comprise the information bits, 0 or more constant bits, additional check bits, or combinations thereof.

11. The method of claim 8, wherein values of the check bits are further calculated such that the modulo-2 sum across one or more paths through the matrix is 0, a length of each path being equal to the minimum number of files, ranks, columns, and rows; and each bit of the path not having a same file as any other bit of the path;

each bit of the path not having a same rank as any other bit of the path;

each bit of the path not having a same column as any other bit of the path; and each bit of the path not having a same row as any other bit of the path.

12. A system comprising:

an encoder and a decoder, each configured to create a low-density parity-check code (LDPC), wherein creating the LDPC comprises:

positioning, using the encoder, coded bits comprising information bits, 0 or more constant bits, and check bits in a three-dimensional matrix having ranks, columns, and rows; and calculating, using the encoder, the check bits such that a modulo-2 sum across the ranks of all combinations of columns and rows, across the columns of all combinations of ranks and rows, and across the rows of all combinations of ranks and columns is 0; and the decoder further configured to perform, based at least on the LDPC, error correction in a communication system.

13. The system of claim 12, wherein the three-dimensional matrix includes basic bits including the information bits, 0 or more constant bits, additional check bits, or combinations thereof arranged in Nx−1 ranks, Ny−1 columns, and Nz−1 rows of the three-dimensional matrix;

wherein an Nx rank includes check bits, each of the check bits in the Nx rank being the sum modulo 2 across ranks 1 to Nx−1 for each combination of column y, $1 \leq y \leq Ny-1$, and row z, $1 \leq z \leq Nz-1$;

wherein an Ny column includes check bits, each of the check bits in the Ny column being the sum modulo 2 across columns 1 to Ny−1 for each combination of rank x, $1 \leq x \leq Nx$, and row z, $1 \leq z \leq Nz-1$; and wherein an Nz row includes check bits, each of the check bits in the Nz row being the sum modulo 2 across rows 1 to Nz−1 for each combination of rank x, $1 \leq x \leq Nx$, and column y, $1 < y < Ny$.

14. The system of claim 13, wherein values of the check bits are further calculated such that the modulo-2 sum across one or more paths through the matrix is 0, a length of each path being equal to a minimum of the number of ranks, columns, and rows; and each bit of the path not having a same rank as any other bit of the path;

each bit of the path not having a same column as any other bit of the path; and each bit of the path not having a same row as any other bit of the path.

15. The system of claim 14, wherein at least one position defined by a selected rank and a selected row and a selected column is not associated with an information bit, and wherein the encoder is further configured to calculate a check bit for the at least one position using bits located at a diagonal pattern of ranks, columns, and rows.

16. The system of claim 15, wherein multiple positions defined by certain rank and certain row and column pairs are not associated with any information bit but are associated with check bits.

17. The system of claim 12, wherein the encoder comprises application specific integrated circuits (ASICs), field programmable gate arrays (FPGAs), processors, or combinations thereof.

18. The system of claim 12, further comprising:

a modulator, communicatively coupled to the code generator, and configured to convert the information bits and the check bits into one or more analog baseband waveforms wherein each of the one or more analog baseband waveforms occurs once for a first set of information bits of the information bits and the check bits.

19. The system of claim 18, further comprising an antenna, an up-converter, an amplifier, and the modulator, or combinations thereof, coupled between the antenna and the encoder, wherein:

the up-converter is configured to convert each of the one or more analog baseband waveforms into a radio frequency (RF) signal, the amplifier is configured to increase an amplitude of the RF signal into a high-power RF signal, and the antenna is configured to radiate the high-power RF signal once for the first set of information bits.

20. A system comprising:

an encoder and a decoder, each configured to create a low-density parity-check code (LDPC), wherein creating the LDPC comprises:

positioning, using the encoder, coded bits comprising information bits, 0 or more constant bits, and check bits in a four-dimensional matrix having files, ranks, columns, and rows; and calculating, using the encoder, the check bits such that a modulo-2 sum across the files of all combinations of ranks, columns, and rows, across the ranks of all combinations of files, columns, and rows, across the columns of all combinations of files, ranks, and rows, and across the rows of all combinations of files, ranks, and columns is 0; and the decoder further configured to perform, based at least on the LDPC, error correction in a communication system.

21. The system of claim 20, wherein the four-dimensional matrix includes basic bits including the information bits, 0 or more constant bits, additional check bits, or combinations thereof arranged in Nw−1 files, Nx−1 ranks, Ny−1 columns, and Nz−1 rows of the four-dimensional matrix;

wherein a Nw file includes check bits, each of the check bits in the Nw file being the sum modulo 2 across files 1 to Nw−1 for each combination of rank x, $1 \leq x \leq Nx-1$, column y, $1 \leq y \leq Ny-1$, and row z, $1 \leq z \leq Nz-1$;

wherein a Nx rank includes check bits, each of the check bits in the Nx rank being the sum modulo 2 across ranks 1 to Nx−1 for each combination of file w, $1 \leq w \leq Nw$, column y, $1 < y < Ny-1$, and row z, $1 \leq z \leq Nz-1$;

wherein a Ny column includes check bits, each of the check bits in the Ny column being the sum modulo 2 across columns 1 to Ny−1 for each combination of file w, $1 \leq w \leq Nw$, rank x, $1 \leq x \leq Nx$, and row z, $1 \leq z \leq Nz-1$; and wherein a Nz row includes check bits, each of the check bits in the Nz row being the sum modulo 2 across rows 1 to Nz−1 for each combination of file w, $1 \leq w \leq Nw$, rank x, $1 \leq x \leq Nx$, and column y, $1 \leq y \leq Ny$.

22. The system of claim 21, wherein values of the check bits are further calculated such that the modulo-2 sum across one or more paths through the matrix is 0, a length of each path being equal to a minimum number of files, ranks, columns, and rows; and each bit of the path not having a same file as any other bit of the path;

each bit of the path not having a same rank as any other bit of the path;

each bit of the path not having a same column as any other bit of the path; and each bit of the path not having a same row as any other bit of the path.

23. The system of claim 22, wherein at least one position defined by a selected file and a selected rank and a selected row and a selected column is not associated with an information bit, and wherein the encoder is further configured to calculate a check bit for the at least one position using bits located at a diagonal pattern of files, ranks, columns, and rows.

* * * * *